(12) United States Patent
Garbar et al.

(10) Patent No.: US 7,736,693 B2
(45) Date of Patent: Jun. 15, 2010

(54) NANO-POWDER-BASED COATING AND INK COMPOSITIONS

(75) Inventors: Arkady Garbar, Yoqneam Illit (IL); Fernando De La Vega, Zichron Yacov (IL); Einat Matzner, Adi (IL); Chariana Sokolinsky, Haifa (IL); Valery Rosenband, Haifa (IL); Anatoly Kiselev, Yokneam (IL); Dmitry Lekhtman, Nazaret-Illit (IL)

(73) Assignee: Cima NanoTech Israel Ltd.

( * ) Notice: Subject to any disclaimer, the term of this patent is extended or adjusted under 35 U.S.C. 154(b) by 1444 days.

(21) Appl. No.: 11/010,948

(22) Filed: Dec. 13, 2004

(65) Prior Publication Data

US 2005/0238804 A1 Oct. 27, 2005

Related U.S. Application Data

(63) Continuation-in-part of application No. PCT/IL03/00502, filed on Jun. 12, 2003, application No. 11/010,948, filed on Dec. 13, 2004, which is a continuation-in-part of application No. PCT/IL03/00554, filed on Jul. 3, 2003.

(60) Provisional application No. 60/387,919, filed on Jun. 13, 2002, provisional application No. 60/393,123, filed on Jul. 3, 2002, provisional application No. 60/609,751, filed on Sep. 14, 2004.

(51) Int. Cl.
*B05D 5/12* (2006.01)
(52) U.S. Cl. .................................................. 427/180
(58) Field of Classification Search .............. 427/123, 427/125, 229, 199, 197, 96.1, 901, 98.4, 427/102, 63
See application file for complete search history.

(56) References Cited

U.S. PATENT DOCUMENTS

| 4,186,244 | A |   | 1/1980  | Deffeyes et al. |
| 5,062,916 | A |   | 11/1991 | Aufderheide et al. |
| 5,178,930 | A | * | 1/1993  | Sakai et al. ............... 428/32.6 |
| 5,421,926 | A | * | 6/1995  | Yukinobu et al. ............ 156/83 |
| 5,476,535 | A |   | 12/1995 | Khasin |
| 5,501,150 | A |   | 3/1996  | Leenders et al. |
| 5,587,111 | A |   | 12/1996 | Watanabe et al. |
| 5,621,449 | A |   | 4/1997  | Leenders et al. |
| 5,667,853 | A |   | 9/1997  | Fukuyoshi et al. |
| 5,750,194 | A |   | 5/1998  | Watanabe et al. |
| 5,785,897 | A |   | 7/1998  | Toufuku et al. |

(Continued)

FOREIGN PATENT DOCUMENTS

EP 0 977 212 2/2000

(Continued)

OTHER PUBLICATIONS

A. S. Reshamwala et al, "linear shrinkage in the sintering of compacts from activated powder", powder Metallurgy and Metal Ceramics, vol. 9(1970)260-265.*

(Continued)

*Primary Examiner*—Michael Cleveland
*Assistant Examiner*—Tabassom Tadayyon Eslami
(74) *Attorney, Agent, or Firm*—Fish & Richardson P.C.

(57) ABSTRACT

Nano-powder-based coating and ink compositions, methods for producing and using these compositions, and articles prepared from these compositions are described.

43 Claims, 9 Drawing Sheets

U.S. PATENT DOCUMENTS

| | | | |
|---|---|---|---|
| 5,837,753 A | | 11/1998 | Caputo |
| 5,882,722 A | * | 3/1999 | Kydd .................... 427/98.4 |
| 5,922,403 A | | 7/1999 | Tecle |
| 5,966,580 A | | 10/1999 | Watanabe et al. |
| 5,998,011 A | | 12/1999 | Hattori et al. |
| 6,012,658 A | * | 1/2000 | Khasin et al. ................ 241/5 |
| 6,036,889 A | | 3/2000 | Kydd |
| 6,086,790 A | | 7/2000 | Hayashi et al. |
| 6,091,151 A | | 7/2000 | Takatsuji et al. |
| 6,104,530 A | * | 8/2000 | Okamura et al. ............ 359/359 |
| 6,106,600 A | | 8/2000 | Lecheheb et al. |
| 6,117,366 A | | 9/2000 | Park et al. |
| 6,136,228 A | | 10/2000 | Hirai et al. |
| 6,143,418 A | | 11/2000 | Takamiya et al. |
| 6,180,030 B1 | | 1/2001 | Hirai et al. |
| 6,190,731 B1 | | 2/2001 | Tecle |
| 6,203,925 B1 | | 3/2001 | Attard et al. |
| 6,207,081 B1 | | 3/2001 | Sasaki et al. |
| 6,207,266 B1 | | 3/2001 | Kanbara et al. |
| 6,214,259 B1 | | 4/2001 | Oda et al. |
| 6,261,479 B1 | | 7/2001 | Yukinobu et al. |
| 6,294,111 B1 | * | 9/2001 | Shacklett et al. ......... 252/518.1 |
| 6,294,401 B1 | | 9/2001 | Jacobson et al. |
| 6,335,056 B1 | | 1/2002 | Lee et al. |
| 6,340,817 B1 | * | 1/2002 | Gelbart .................... 250/341.6 |
| 6,356,234 B1 | | 3/2002 | Harrison et al. |
| 6,379,745 B1 | | 4/2002 | Kydd et al. |
| 6,398,985 B2 | | 6/2002 | Yukinobu et al. |
| 6,416,818 B1 | | 7/2002 | Aikens et al. |
| 6,447,909 B1 | | 9/2002 | Kato et al. |
| 6,451,433 B1 | | 9/2002 | Oka et al. |
| 6,517,931 B1 | | 2/2003 | Fu |
| 6,528,112 B2 | | 3/2003 | Kato et al. |
| 6,544,371 B2 | * | 4/2003 | Senoo et al. ................ 156/230 |
| 6,558,581 B2 | | 5/2003 | Yukinobu et al. |
| 6,566,665 B2 | | 5/2003 | Baglin et al. |
| 6,569,359 B2 | * | 5/2003 | Yukinobu et al. ........... 252/514 |
| 6,632,589 B2 | * | 10/2003 | Inno et al. .................. 430/303 |
| 6,673,142 B2 | | 1/2004 | Tofuku et al. |
| 6,679,971 B2 | | 1/2004 | Tone et al. |
| 6,686,249 B1 | | 2/2004 | Yukinobu et al. |
| 6,686,536 B2 | | 2/2004 | Tone et al. |
| 6,689,189 B1 | | 2/2004 | Gornerup |
| 6,712,998 B2 | | 3/2004 | Kato |
| 6,716,480 B2 | | 4/2004 | Yukinobu et al. |
| 6,751,083 B1 | | 6/2004 | Gleiter et al. |
| 6,777,872 B2 | | 8/2004 | Aoki et al. |
| 6,780,772 B2 | | 8/2004 | Uzoh et al. |
| 6,784,223 B2 | | 8/2004 | Krohn |
| 6,808,654 B2 | | 10/2004 | Hayashi et al. |
| 6,878,184 B1 | | 4/2005 | Rockenberger et al. |
| 6,884,936 B2 | | 4/2005 | Takahashi et al. |
| 6,891,324 B2 | | 5/2005 | Dorfman |
| 6,911,385 B1 | | 6/2005 | Haubrich et al. |
| 6,921,626 B2 | | 7/2005 | Ray et al. |
| 6,921,788 B1 | | 7/2005 | Izawa et al. |
| 6,923,923 B2 | | 8/2005 | Cheon et al. |
| 6,951,666 B2 | | 10/2005 | Kodas et al. |
| 6,972,256 B2 | * | 12/2005 | Fukunaga et al. ........... 438/679 |
| 7,002,297 B2 | | 2/2006 | Aoki et al. |
| 7,004,994 B2 | | 2/2006 | Hampden-Smith et al. |
| 7,033,667 B2 | | 4/2006 | Voss-Kehl et al. |
| 7,053,126 B2 | | 5/2006 | Yukinobu et al. |
| 2003/0110978 A1 | | 6/2003 | Abe et al. |
| 2003/0116057 A1 | | 6/2003 | Suzuki et al. |
| 2003/0146019 A1 | | 8/2003 | Hirai |
| 2003/0148024 A1 | * | 8/2003 | Kodas et al. ................ 427/125 |
| 2003/0170448 A1 | | 9/2003 | Yukinobu et al. |
| 2003/0180451 A1 | * | 9/2003 | Kodas et al. ................ 427/123 |
| 2003/0180511 A1 | | 9/2003 | Yukinobu et al. |
| 2004/0004209 A1 | | 1/2004 | Matsuba et al. |
| 2004/0043691 A1 | | 3/2004 | Abe et al. |
| 2004/0091731 A1 | | 5/2004 | Tofuku et al. |
| 2004/0112175 A1 | | 6/2004 | Ishihara et al. |
| 2004/0191641 A1 | | 9/2004 | Ray et al. |
| 2005/0136638 A1 | | 6/2005 | Voss-Kehl et al. |
| 2005/0199860 A1 | | 9/2005 | Yukinobu et al. |
| 2005/0214522 A1 | | 9/2005 | Yukinobu et al. |
| 2006/0001726 A1 | | 1/2006 | Kodas et al. |
| 2006/0016371 A1 | | 1/2006 | Yadav |

FOREIGN PATENT DOCUMENTS

| | | |
|---|---|---|
| EP | 1 323 793 | 7/2003 |
| EP | 1 628 310 | 2/2006 |
| JP | 10-101123 | 4/1998 |
| JP | 10-142401 | 5/1998 |
| WO | WO 01/30520 | 5/2001 |
| WO | WO 03/038002 | 5/2003 |
| WO | WO 2004/000491 | 12/2003 |
| WO | WO 2004/052559 | 6/2004 |
| WO | WO 2005/101427 | 10/2005 |
| WO | WO 2005/115637 | 12/2005 |

OTHER PUBLICATIONS

Alger, *Polymer Science Directory*, 1997, $2^{nd}$ edition, pp. 411-412.

Curtis et al., "Metallizations by Direct-Write Inkjet Printing," *NCPV Program Review Meeting*, Oct. 1, 2001, Lakewood, CO, pp. 249-252.

Fuller et al., "Ink-Jet Printed Nanoparticle Microelectromechanical Systems," *J. Microelectromech. Sys.*, 2002, 11(1):54-60.

Teng and Vest, "A Microprocessor-Controlled Ink Jet Printing System for Electronic Circuits," *IEEE Trans. Ind. Electron.*, 1988, 35(3):407-412.

Teng and Vest, "Application of Ink Jet Technology on Photovoltaic Metallization," *IEEE Electron Device Lett.*, 1988, 9(11):591-592.

Vest et al., "Ink Jet Printing of Hybrid Circuits," *Int'l. J. Hybrid Microelectronics*, 1983, 6(1):261-267.

Wuelfing et al., "Monolayer-Protected Clusters: Molecular Precursors to Metal Films," *Chem. Mater.*, 2001, 13:87-95.

Jing Tang et al., "Gas-Liquid-Solid Phase Transition Model for Two-Dimensional Nanocrystal Self-Assembly on Graphite", *J. Phys. Chem. B* 2002, vol. 106, pp. 5653-5658.

M. Maillard et al., "Rings and Hexagons Made of Nanocrystals: A Marangoni Effect", *J. Phys. Chem. B*, 2000, vol. 104, pp. 11871-11877.

Guanglu Ge et al., "Evidence for Spinodal Phase Separation in Two-Dimensional Nanocrystal Self-Assembly", *J. Phys. Chem. B*, 2000, vol. 104, pp. 9573-9575.

Cynthia Stowell et al., "Self-Assembled Honeycomb Networks of Gold Nanocrystals", *Nano Letters*, 2001, vol. 1, pp. 595-600.

Eran Rabani et al., "Drying-mediated self-assembly of nanoparticles", *Nature*, 2003, vol. 426, pp. 271-274.

* cited by examiner

L302 473
SSA=10.3 m²/g

NANO-POWDER-BASED COATING AND INK COMPOSITIONS

This application is a continuation-in-part of the following commonly owned, pending applications, each of which is hereby incorporated by reference in its entirety:

(1) PCT/IL03/00502 entitled "A Method for the Production of Conductive and Transparent Nano-Coatings and Nano-Inks and Nano-Powder Coatings and Inks Produced Thereby," filed Jun. 12, 2003 designating the United States, which derives priority from U.S. Provisional Application No. 60/387,919 filed Jun. 13, 2002;

(2) PCT/IL2003/000554 entitled "Low Sintering Temperatures Conductive Nano-Inks and a Method for Producing the Same," filed Jul. 3, 2003 designating the United States, which derives priority from U.S. Provisional Application No. 60/393,123 filed Jul. 3, 2002; and (3) U.S. Provisional Application No. 60/609,751 entitled "Low Temperature Sintering Process for Preparing Conductive Printed Patterns on Substrates, and Articles Based Thereon," filed Sep. 14, 2004.

FIELD OF THE INVENTION

The present invention generally relates to the production and use of nano-powder-based coating and ink compositions.

BACKGROUND

Nano particles, especially metal nano particles have very special properties which are directly related to their dimensions and to the fact that a large ratio of the atoms in the particle are in the surface of the particle or at particle and grain boundaries. These properties include optical properties, sintering and diffusion properties, electrical properties like capacitance, impedance and resistance, catalytic activity and many others.

These improved properties have a range of uses and applications; e.g. catalysts for chemical reactions, electrodes, fuel cells, medical devices, water cleaning technologies, electronic devices, coatings, and more.

U.S. Pat. No. 5,476,535 to the applicant present a method for the production of nano-powders, especially of silver. This process comprising the steps of (a) forming an aluminum-silver alloy of a specific blend composition; (b) leaching the aluminum ingredient by a series of consequent leaching steps wherein a fresh leaching agent is reacting the treated solid material, providing a gradually porous and homogeneous silver alloy. Ultrasonic oscillations are applied in step (c), disintegrating the agglomerate and enhancing the penetration of the leaching agent into the ever growing porous of the alloy by the application of a plurality of ultrasonic oscillations. The leaching agent is leaving silver agglomerate in step (d), and then the agglomerate is washed and dried in a final step.

According to U.S. Pat. No. 6,012,658 to the applicant et al., the very same process was used as is to form metal flakes. Thus, the following two main steps were introduced: comminuting the alloys obtained by the aforementioned U.S. Pat. No. 5,476,535 into defined particles, and then faltering the obtained particles into strip-like highly porous alloys of predetermined characteristics.

SUMMARY

In one aspect, there is described a method for coating a substrate by conductive and/or transparent nano-powders in either ordered or random pattern, wherein said pattern is obtained either spontaneously or as a result of a printing technique. It is well in the scope of the present invention to use nano metal additives to produce a transparent-conductive coating such in the case of nano titanium dioxide additives that was proved useful for the production of coatings transparent to visible light and opaque to UV wave lengths; in the case of nano silica additives, that was found useful for the production of transparent coatings with special resistance performance; and in the case of nano pigments, that proved useful for the production of transparent colored coatings.

In another aspect, there is described a method for the production of conductive and transparent coatings comprising metal nano-powders. Said method comprising the steps of (i) admixing metal nano powder in a solvent with at least one ingredient of the group: binder, surfactant, additive, polymer, buffer, dispersant and/or coupling agent in the manner a homogenized solution is obtained; (ii) applying the homogenized mixture obtained above on a surface to be coated by various manners: screen printing, spreading, spin coating, dipping etc.; (iii) evaporating the solvent from said homogenized mixture; and (iv) sintering the coated layer so a conductive and transparent coating is obtained on top of said surface.

The metal nano powders may be used alone or in combination with conductivity improving additives selected from at least one of the group: metal colloids and/or metal reducible salt and/or organic metal complexes and/or organo metal compounds which decompose to form conductive materials. Preferably, the concentration of the metal nano powder in the admixed solution is between 1% (wt) to 50% (wt) and more particularly, in the range of 2% (wt) to 10% (wt).

It is further in the scope of the present invention wherein the admixed solution comprises organic solvent or a mixture of organic solvents. Those organic solvents are characterized by an evaporation rate higher than the evaporation rate of water at ambient conditions. The concentration of the organic solvent or the mixture of organic solvents in the admixed solution is between 20% (wt) to 85% (wt), more specifically, in the range 40% (wt) to 80% (wt). It is acknowledged in this respect that the solvents can be selected from at least one of the group of petroleum ether, hexanes, heptanes, toluene, benzene, dichloroethane, trichloroethylene, chloroform, dichloromethane, nitromethane, dibromomethane, cyclopentanone, cyclohexanone, UV and thermally curable monomers (e.g., acrylates), or any mixture thereof.

It is further in the scope of the present invention wherein the concentration of the aforementioned binder in the admixed solution is between 0% (wt) to 3% (wt). Preferably (but not limited to), the binder is selected from ethyl cellulose and/or modified urea.

In yet another aspect, there is described a method for the production of inks or solutions comprising metal nano-powders for the production of transparent and conductive coatings. This method is in principle similar to the one defined above, and comprises the following steps: (i) admixing metal nano-powder in a solvent with at least one ingredient of the group: binder, surfactant, additive, polymer, buffer, dispersant and/or coupling agent in the manner a homogenized solution is obtained; (ii) admixing said homogenized mixture with water or water miscible solvent or mixture of water miscible solvents in the manner a W/O type emulsion is obtained; (iii) applying the emulsion obtained above on said surface to be coated, e.g., by spreading, spin coating, dipping etc.; (iv) evaporating the solvent from said homogenized mixture in the manner that a self-assembled network-like pattern is developed in situ; and lastly; (v) sintering the network-like pattern so a conductive and transparent coating is obtained.

It is in the scope of the present invention wherein the concentration of the aforementioned surfactant or surfactants mixture is between 0% (wt) to 4% (wt) and/or wherein the concentration of the surfactant or surfactants mixture in the dispersed emulsion is between 0% (wt) to 4% (wt). Preferably, a W/O emulsion is obtained by said methods.

It is further in the scope of the present invention wherein the concentration of the water miscible solvent or mixture of water miscible solvents in the dispersed emulsion is between 5% (wt) to 70% (wt). Preferably (but not limited to), the surfactant or surfactants mixture defined above comprises at least one of the group of non-ionic and ionic compounds, selected from SPAN-20, SPAN-80, glyceryl monooleate, sodium dodecyl sulfate, or any combination thereof. Moreover, it is also in the scope of the present invention wherein the concentration of the water miscible solvent or mixture of water miscible solvents in the dispersed emulsion is between 15% (wt) to 55% (wt).

It is further in the scope of the present invention wherein the aforementioned water miscible solvent or solvent mixture is selected from (but not limited to) at least one of the group of water, methanol, ethanol, ethylene glycol, glycerol, dimethylformamid, dimethylacetamid, acetonitrile, dimethylsulfoxide, N-methylpyrrolidone or any mixture thereof.

There is also described a method, as defined in any of the above, wherein the surface to be coated is selected from paper, metal, ceramics, glass, either flexible or relatively non-flexible polymeric films or sheets or any combination thereof. More specifically, the polymeric film comprises at least one of the group of polyesters, polyamides, polyimides (e.g., Kapton), polycarbonates, polyethylene, polyethylene products, polypropylene, acrylate-containing products, polymethyl methacrylates (PMMA), their copolymers or any combination thereof, or any other transparent or printable substrate. Additionally or alternatively, the method defined above comprises another step of treating the surface to be coated by a means of corona treatment and/or a primer.

It is further in the scope of the present invention wherein the aforementioned primer is selected (but not limited to) from at least one of the group of 3-aminopropyl triethoxy silane, phenyl trimethoxysilane, glycidyl trimethoxysilane, commercially available Tween products, Tween-80, neoalkoxy tri(dioctylpropylphosphato) titanate or any combination thereof.

It is further in the scope of the present invention wherein the aforementioned nano-powder comprises metal or a mixture of metals (including metal alloys) selected from (but not limited to) silver, gold, platinum, palladium, nickel, cobalt, copper or any combination thereof.

It is further in the scope of the present invention wherein the spreading of the homogenized mixture on a surface to be coated is provided by a means selected from simple spreading; bar spreading; immersing; spin coating; doping; dipping or any other suitable technique. Moreover, according to one embodiment of the present invention, the step of coating layer or layers provided by the spreading of the homogenized mixture on a surface to be coated is provided for a wet thickness of 1 to 200 microns, e.g., 5 to 200 microns.

It is further in the scope of the present invention wherein the sintering of the evaporated homogenized solution is provided in the temperature range of 50° C. to 300° C. for 0.5 to 2 hours. Alternatively, the sintering of the network-like pattern is provided in the temperature range of 50° C. to 150° C. for 2 to 30 minutes.

It another object of the present invention to provide a cost-effective and novel conductive and transparent coating layer comprising metal nano-powders, as described above. Additionally or alternatively, a conductive and transparent ink or coating layer or layers is provided that is characterized by self-assembled network pattern.

It is also in the scope of the present invention wherein the aforementioned conductive and transparent coating layer is characterized by light transparencies in the range of 30% to 90% at 400 nm to 700 nm wavelength; resistances in the range of 0.1 Ω/square to 10 kΩ/square and by haze value in the range of 0.5% to 10%; and wherein the conductive and transparent ink layer is characterized by light transparencies in the range of 10% to 90% at 400 nm to 700 nm wavelength; resistances in the range of 0.1 Ω/square to 1,000 Ω/square, and by a haze value in the range of 0.1% to 5%. Also described are conductive inks (e.g., nano-powders characterized by resistances between 0.005 Ω/square to 5 kΩ/square) comprising metal nano-powders.

It is further in the scope of the present invention wherein the conductive and transparent coating layer defined above is characterized by either ordered or random patterns, wherein said patterns are provided by printing, ink-jet printing, ink-jet disposition, self-assembling or self organizing or any other suitable technique. Said conductive and transparent coating layer or the multiple layer array may further be provided with a protective layer, anti-scratch layer, a layer to enhance conductivity, a layer to enhance adhesion to a surface to be coated or any combination thereof. Moreover, the obtained conductive and transparent coating layer or the aforementioned multiple layer array may be especially adapted to be used in at least one of the group of screens, displays, electrodes, PCBs, ink-jet products, ink-jet disposition products, smart cards, RFID, antenna, thin-film transistors, LCDs or any combination thereof.

Also described are methods for producing conductive inks comprising metal nano-powders where the method comprises inter alia the following four steps: (i) admixing metal nano powder in a solvent with at least one ingredient of the group selected from: binder, surfactant, additive, polymer, buffer, dispersant and/or coupling agent in the manner a homogenized solution is obtained; (ii) applying the homogenized mixture obtained above on a surface to be coated; (iii) evaporating the solvent from said homogenized mixture; and (iv) sintering the coated layer at a temperature range of 50° C. to 350° C., providing a conductive ink on top of said surface characterized by resistances between 0.005 Ω/square to 5 kΩ/square. Said sintering is preferably provided at ambient pressure (e.g., about atmospheric pressure).

Also described is a low temperature (e.g., less than 100° C., preferably less than 70° C., and even more preferably at room temperature) sintering process for sintering compositions comprising nano metal particles deposited (e.g., printed) on a substrate. Resistivities following sintering are below about 300 μΩcm, preferably below about 100 μΩcm, and more preferably below about 30 μΩcm. Resistivities may be further reduced using techniques such as electroplating following deposition.

The sintering process is conducted in the presence of a chemical that induces the sintering process. Examples of suitable chemicals include formic acid, acetic acid, and formaldehyde. The chemical may be in the form of a vapor or a liquid to which the deposited particles are exposed. Alternatively, it may be incorporated into the composition comprising the nano metal particles prior to deposition, or may be deposited on the nano metal particles after depositing the particles on the substrate.

A wide variety of substrates can be used, including both flexible and rigid substrates, polymer films (e.g., polyethylene terephthalate and polyolefins such as biaxially oriented polypropylene), plastics, paper (including photographic paper), textiles, printed circuit boards, epoxy resins, and the like. The process is particularly useful for substrates such as paper or polymer films having Tg's or melting points under about 150° C., which cannot withstand high sintering temperatures (e.g., 300° C. or higher).

Suitable nano metal particles include silver, silver-copper alloys, silver palladium or other silver alloys or metals or metals alloys produced by the process Metallurgic Chemical Process (MCP) described in U.S. Pat. No. 5,476,535 ("Method of producing high purity ultra-fine metal powder") and PCT application WO 2004/000491 A2 ("A Method for the Production of Highly Pure Metallic Nano-Powders and Nano-Powders Produced Thereof"). The powders produced hereby have a "non uniform spherical" deformed ellipsoidal, worm like shape (see FIGS. 10 and 11) and its chemical composition can include up to 0.4% (by weight) of aluminum, both of which are unique to this production method.

Particularly useful compositions (inks and dispersions) for depositing the nano metal particles include ink jet printable compositions in which the particles are combined with a liquid carrier as described in Provisional Application No. 60/609,750 entitled "Ink Jet Printable Compositions" filed Sep. 14, 2004, which is incorporated by reference in its entirety. These inks and dispersions have properties that enable their jettability (printing through ink jet heads which possess small nozzles, usually in the micron range). These properties include the following: low viscosities between 1 and 200 cP (at room temperature or at jetting temperature), surface tension between 20-37 dyne/cm for solvent-based dispersions and 30-60 dyne/cm for water-based dispersions, metal loadings of nano particles between 1% and 70% (weight by weight), low particle size distribution of the metal nano-particle material having a particle size distribution (PSD) D90 below 150 nm, preferably below 80 nm. The compositions have stabilities sufficient to enable jetting with minimum settling, and without clogging the print head or changing the properties of the compositions. The compositions can be printed by different technologies, including continuous ink jet technologies, drop on demand technologies (such as piezo and thermal), and also additional technologies like air brush, flexo, electrostatic deposition, wax hot melt, etc.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
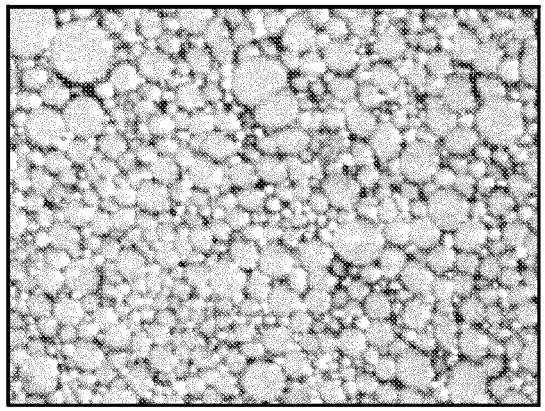
FIG. 1 presents a view taken by a means of a light microscope showing the self-assembling pattern of an ink disposed on a glass surface as obtained by the method of one embodiment of the present invention.

In one aspect, a novel method for the production of conductive and transparent coatings and inks comprising metal nano-powders (i.e., coatings or inks) is hereby presented. The hereto-defined method takes full advantage of the fact that nano sized particles and grains have much larger surface areas than bulk materials, have special optical properties and can be worked to produce a conductive phase. By coating a substrate with an ink, solution or paste that was previously dispersed, cost-effective nano-conductive materials and/or conductive transparent coatings are produced. Those coatings and inks are generally characterized by (1) light transparencies between 40% to 90% in the visible range of about 400 nm to 700 nm wavelength; by (2), resistances between 0.1 Ω/square to 9 kΩ/square, and (3), by a relatively low haze values, generally ranges from 1% to 10%.

In another aspect, a novel method of low temperature sintering useful for the production of conductive coatings and inks comprising metal nano-powders (i.e., coatings or inks) is hereby presented. By coating a substrate with an ink, solution or paste that was previously dispersed, cost-effective nano-conductive materials and/or conductive transparent coatings are produced.

As noted above, the nano-powders (e.g., powders characterized by $D_{50}<60$ nm and $D_{90}<100$ nm) have a much larger surface area than bulk materials, are characterized by special diffusion properties, and can be processed so a continuous conductive phase is produced at relatively low temperatures and a lower energy input.

In some embodiments, the term "coating" refers to any conductive and transparent optical layer produced in the manner of admixing metal nano powder in a solvent with at least one ingredient of the group: binder, surfactant, additive, polymer, buffer, dispersant and/or coupling agent in the manner a homogenized solution is obtained; spreading the homogenized mixture obtained above on a surface to be coated; evaporating the solvent from said homogenized mixture; and then sintering the coated layer so a conductive and transparent coating is obtained on top of said surface.

In other embodiments, the term "coating" refers to any conductive layer produced in the manner of admixing metal nano powder in a solvent with at least one ingredient of the group: binder, surfactant, additive, polymer, buffer, -dispersant and/or coupling agent in the manner a homogenized solution is obtained; and then sintering at low temperatures of 50 to 300° C.

In some embodiments, the term "ink" refers to any ink containing nano-powders of metal or metals, especially emulsion based compositions provided for coloring materials, or alternatively, to legend ink (marking ink) suitable for printing on printed circuit boards (PCB's).

More specifically, in some embodiments the term "ink" refers to any conductive and transparent topical pattern produced in the manner of admixing metal nano powder in a solvent with at least one ingredient of the group: binder, additive, polymer, buffer, dispersant and/or coupling agent in the manner a homogenized solution is obtained; admixing said homogenized mixture with water or water miscible solvent or mixture of water miscible solvents in the manner a W/O type emulsion is obtained; spreading the homogenized mixture obtained above on said surface to be coated; evaporating the solvent from said homogenized mixture in the manner that a self-assembled network-like pattern is developed in situ; and then sintering the network-like pattern so a conductive and transparent ink is obtained.

In other embodiments, the term "ink" refers to any conductive topical pattern produced in the manner of admixing metal nano powder in a solvent with at least one ingredient of the group: binder, additive, polymer, buffer, dispersant and/or coupling agent in the manner a homogenized solution is obtained; optionally admixing the solution with water or water-miscible solvent or a mixture of water-miscible solvents in the manner a W/O type emulsion is obtained; spreading or printing the homogenized mixture obtained above on said surface to be coated; evaporating the solvent from said homogenized mixture in the manner that a self-assembled network-like pattern is developed in situ or a printed pattern or a complete coverage is formed; and then sintering the network-like pattern at low temperatures of 50 to 300° C. so a conductive nano-ink is obtained.

The inks (e.g., ink paste, inks, solutions, coatings) are especially adapted for use in or on top of transparent substrates. The aforementioned ink is adapted for coating, covering, immersing, dipping, and/or entrapping on top or into either solid or semi-solid matrix, or by means of any other suitable technique on such as glass or any polymer matrix, including flexible, semi-flexible or rigid materials. In some embodiments, due to their significant transparency in the visible wavelength range of about 400 nm to 700 nm, the aforementioned conductive inks are especially useful for screens, displays, liquid crystalline displays, smart cards and/or for any technology using ink-jets printers or any other technology of printing electronic matter.

The coating techniques that we have used are screen-printing, manual applicator and manual spreading. Other suitable techniques such as spin coating, spray coating, ink jet printing, offset printing and any suitable technique can also be used. Any type of transparent and non-transparent substrate can be coated for example glass, polycarbonate, polymer films and others.

Various ink/paste and coating systems have been found useful to produce a transparent-conductive coating, which differ in the formulation concept, and main ingredients leading to the conductivity and transparency. The main ingredients are selected from metal nano powder; metal nano powder with metal colloids; metal nano powder with a metal reducible salt; and/or organic metal complexes and/or organometal compounds which decompose to form conductive materials and all the above in a self-organizing system.

These nano metal based coating systems can achieve light transmittances of up to 95% (measured between 400 nm and 700 nm), low haze values, and resistances as low as 1 Ω/square.

The ink or pastes may be prepared according to the general procedure described below. Care has to be taken to achieve a good dispersion of the conductive additives (metal nano powders, salts, colloids and other additives).

The substrate is coated with the ink or paste. The coating can be performed using the different techniques previously described. The technique is chosen to enable control of physical parameters such as thickness and printed geometries (to obtain the desired transmittance and resistance). The sample may be heated, to obtain the desired resistance, to between 50° C. to 300° C. for 0.5 to 2 hours.

In some embodiments, a substrate is coated with a solution or paste in which the nano metal powder is dispersed, and sintered at low temperatures of about 50° C. and preferably around 100° C. to 220° C. to produce conductive layers characterized by resistances between 0.005 Ω/square to 5 Ω/square. These resistance values are comparable to resistivity values of between $2.1 \cdot 10^{-5}$ and $6.6 \cdot 10^{-4}$ Ω·cm. The lowest resistivity obtained is about only 1.5 times higher than bulk silver as measured in our system. While commercially available and literature cited technologies suggest that producing conductive layers requires sintering temperatures over 300° C. and usually near 900° C., the present invention discloses, in certain embodiments, a novel method of sintering at temperatures lower than 250° C. and/or lower than the Tg or melting point of flexible materials such as plastics and polymers.

In some embodiments, the term "sintering" refers to any process of forming objects from a metal powder by heating the powder at a temperature below its melting point. In the production of small metal objects it is often not practical to cast them. Through chemical or mechanical procedures a fine powder of the metal can be produced. When the powder is compacted into the desired shape and heated, i.e., sintered, for up to three hours, the particles composing the powder join together to form a single solid object.

Figure 12:
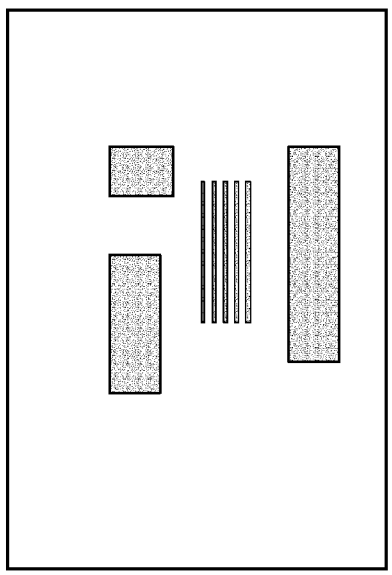
FIG. 12 illustrates a typical ink jet printed pattern.

The nano metal particle-containing composition, in which the particles are dispersed in a liquid carrier, is printed, preferably by ink jet printing, onto the surface of a substrate. The resulting pattern can have any shape, geometry, or form achievable using the particular printing technique. A representative pattern is shown in FIG. 12.

Figure 13:
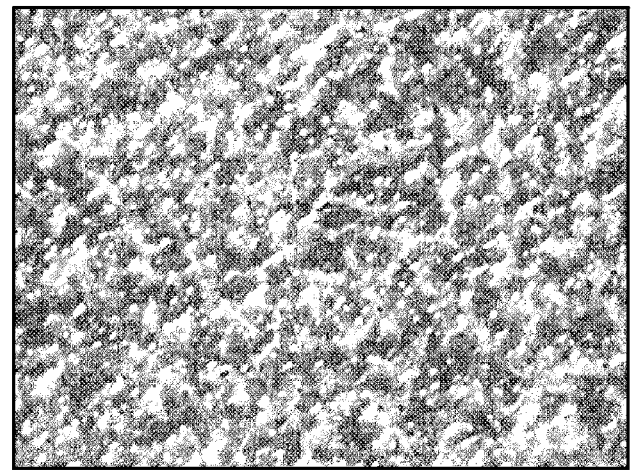
FIGS. 13 and 14 are Optical Microscopy Photographs of representative printed patterns prior to sintering.
Figure 14:
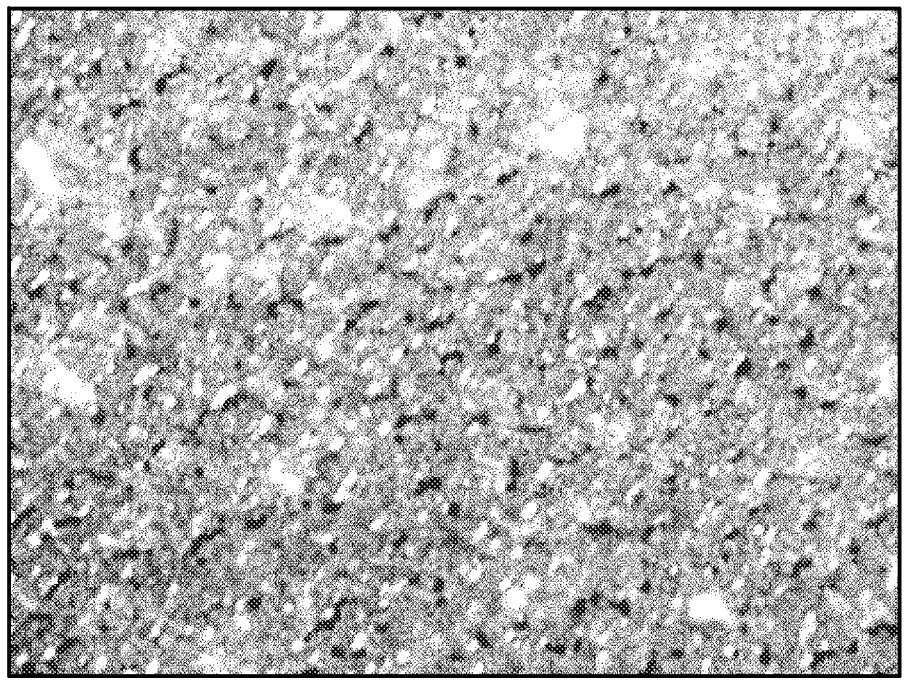

FIGS. 13 and 14 illustrate representative printed patterns prior to sintering. The patterns, which are gray to dark gray in color, include drop-like shapes attributable to the ink jet printing process.

Figure 15:
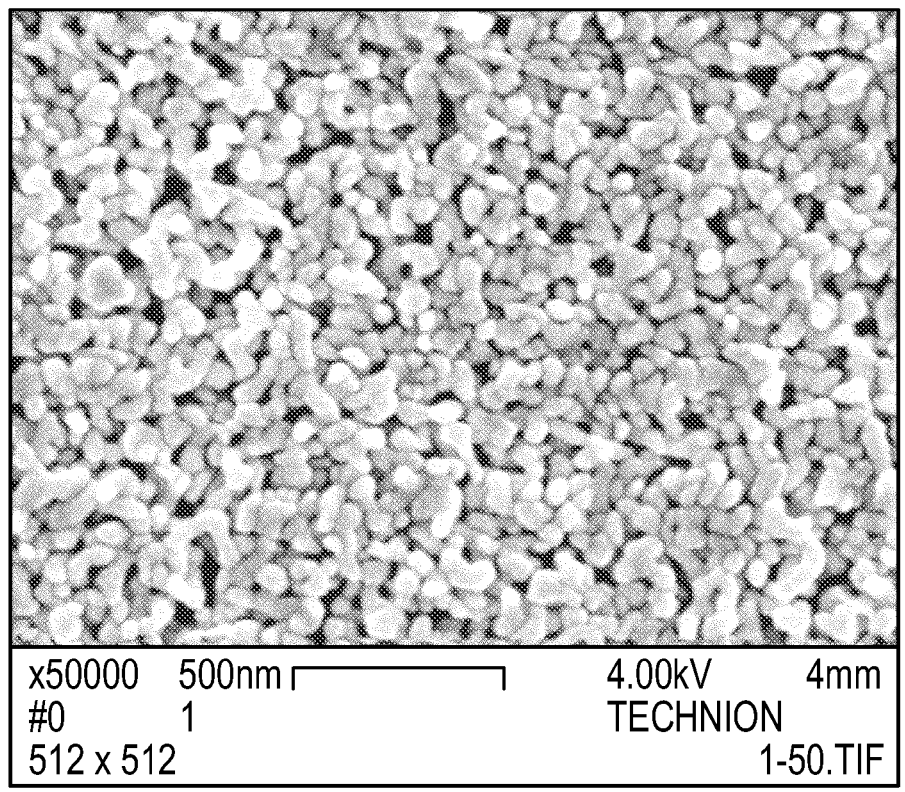
FIGS. 15 and 16 are Scanning Electron Microscopy Photographs of representative printed patterns prior to sintering.
Figure 16:
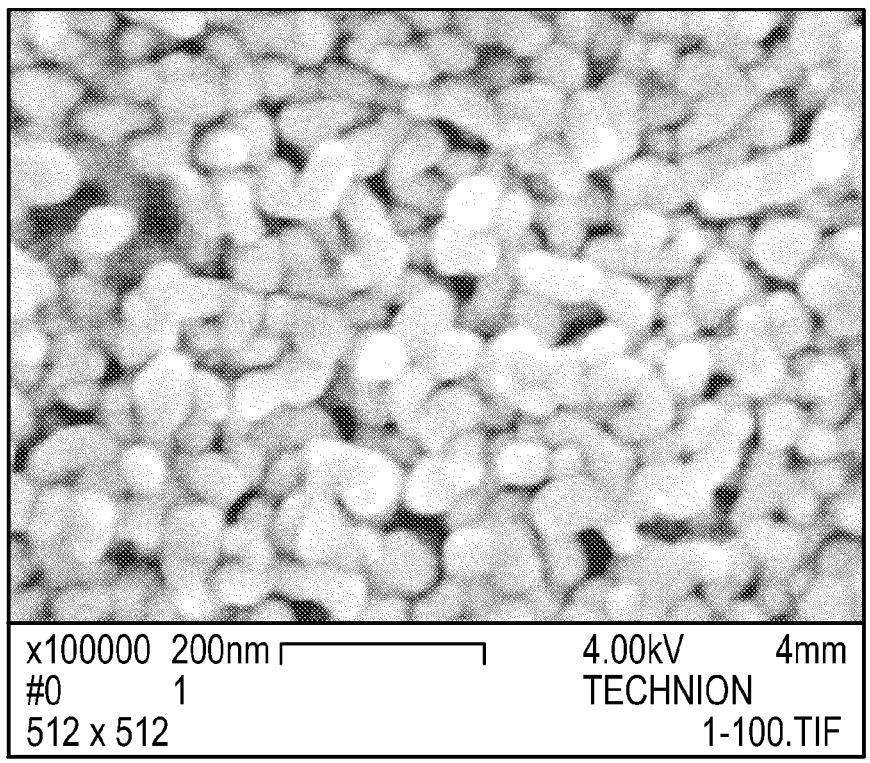
Figure 17:
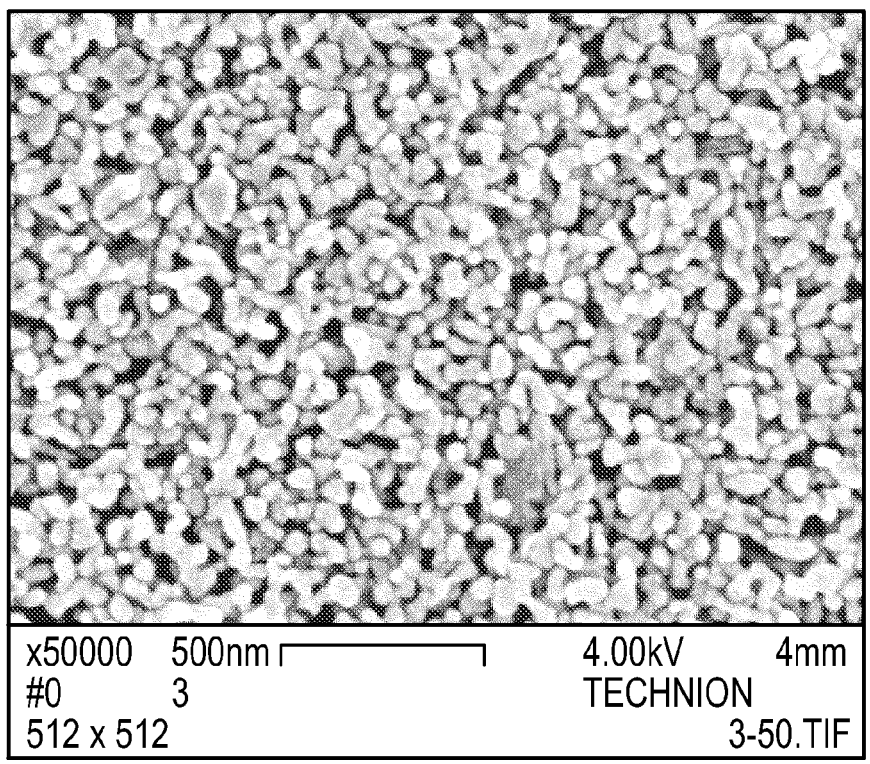
FIGS. 17 and 18 are Scanning Electron Microscopy Photographs of representative printed patterns after heat sintering at 150° C.
Figure 18:
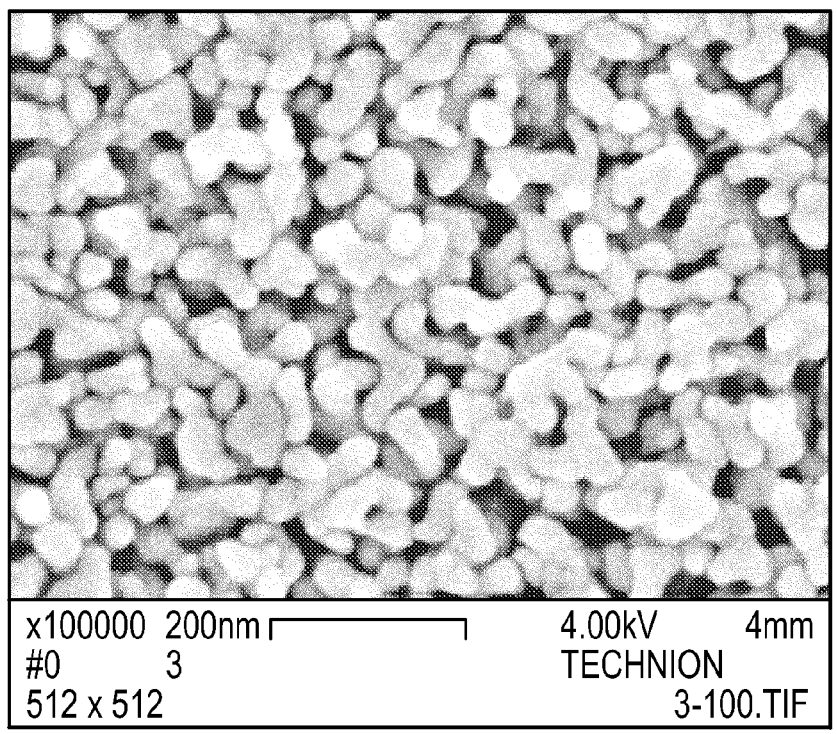
Figure 19:
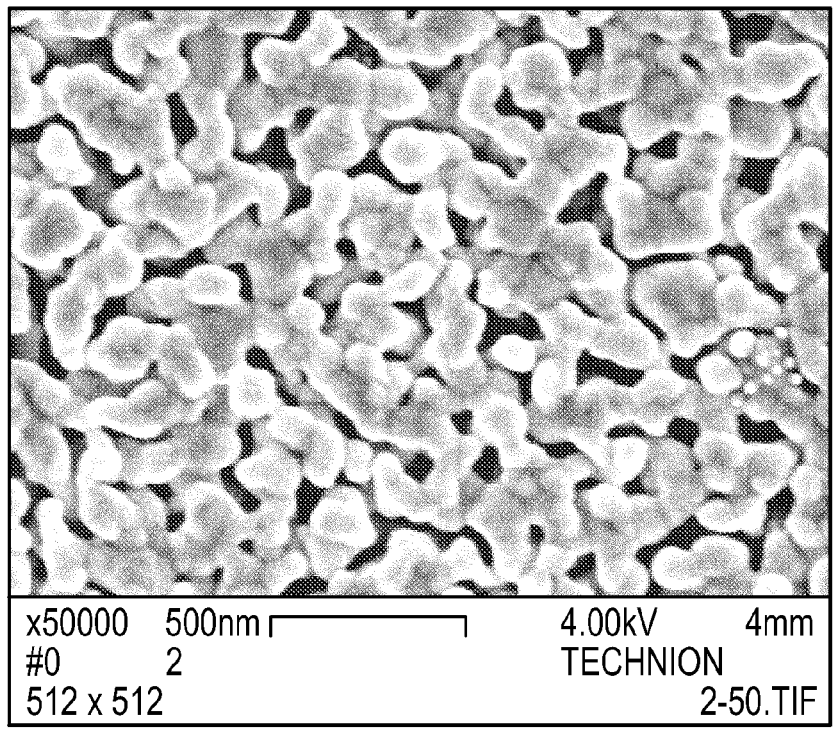
FIGS. 19 and 20 are Scanning Electron Microscopy Photographs of representative printed patterns after chemical sintering at 70° C.
Figure 20:
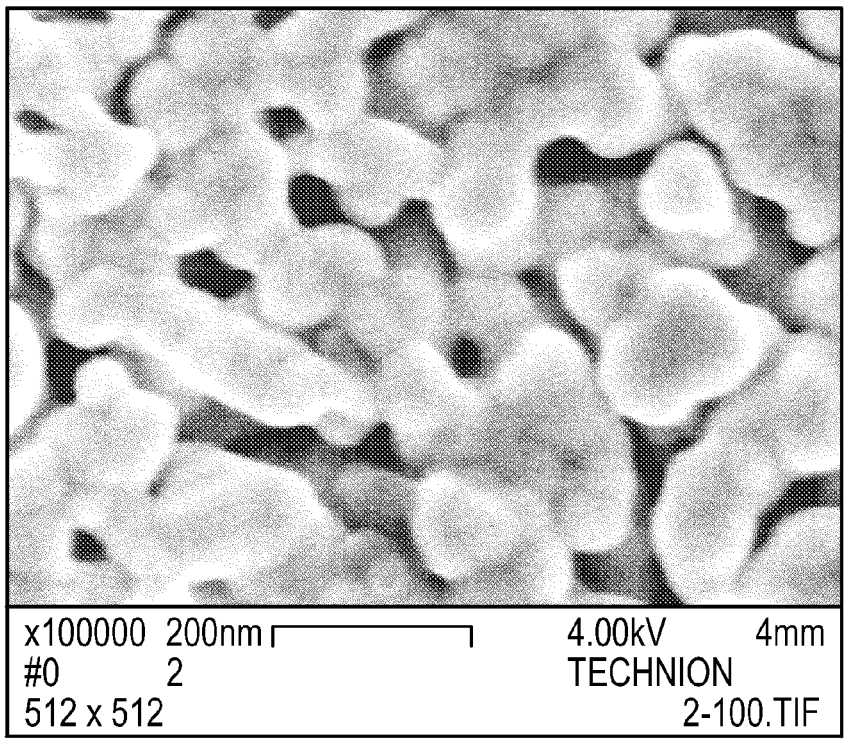

Heat sintering such printed patterns, e.g., at temperatures on the order of 150° C. to 200° C., yields a different result compared to chemical sintering at much lower temperatures, e.g., on the order of 70° C. This can be seen by comparing (a) FIGS. 15 and 16, which depict printed patterns prior to sintering, (b) FIGS. 17 and 18, which illustrate printed patterns heat sintered at 150° C. and (c) FIGS. 19 and 20, which illustrate printed patterns chemically sintered at 70° C. It is clear that during the low temperature chemical sintering process ("CSM") the particles grow substantially, forming bigger particles compared to the heat sintered material. This has been correlated by surface area measurements performed on dry powder sintering (see the following table). "FAV" refers to formic acid vapor.

TABLE A

Surface Area Change with Sintering Process.

| Powder | Sintering method | Surface Area $mt^2/gr$ |
|---|---|---|
| 414 L303 | Before sintering | 6.5 |
| 414 L303 | 60° C., 24 hr | 5.3 |
| 414 L303 | CSM - FAV, 60° C., 24 hr | 1.4 |
| 473-G51 W025 | Before sintering | 8.3 |
| 473-G51 W025 | 200° C., 0.5 hr | 8.5 |
| 473-G51 W025 | 300° C., 0.5 hr | 6.9 |
| 473-G51 W025 | CSM - FAV, 60° C., 24 hr | 3.5 |

Figure 21:
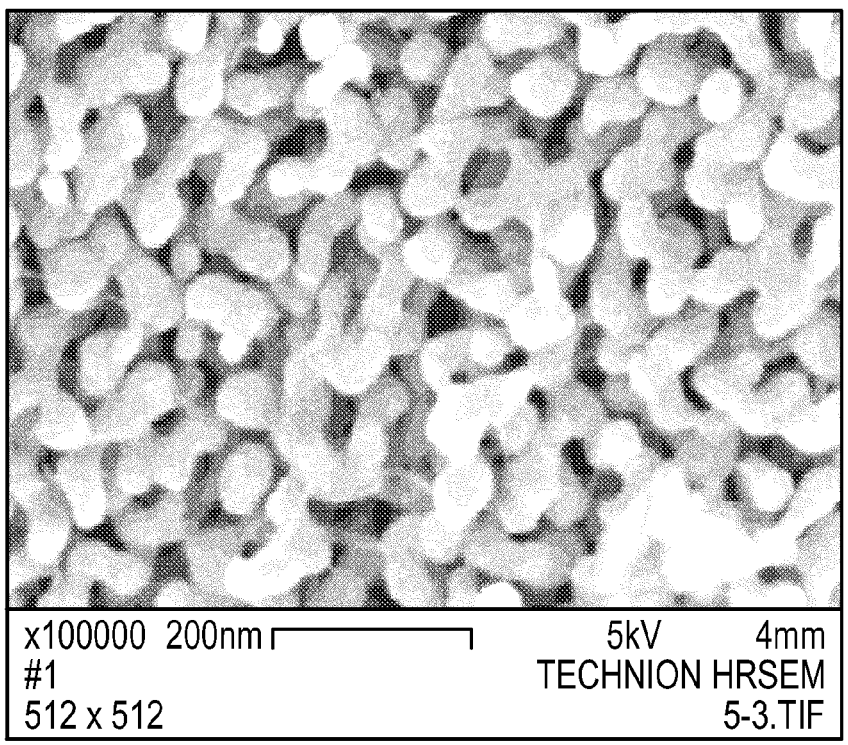
FIGS. 21 and 22 are Scanning Electron Microscopy Photographs of dry metal nano powders exposed to formic acid.
Figure 22:
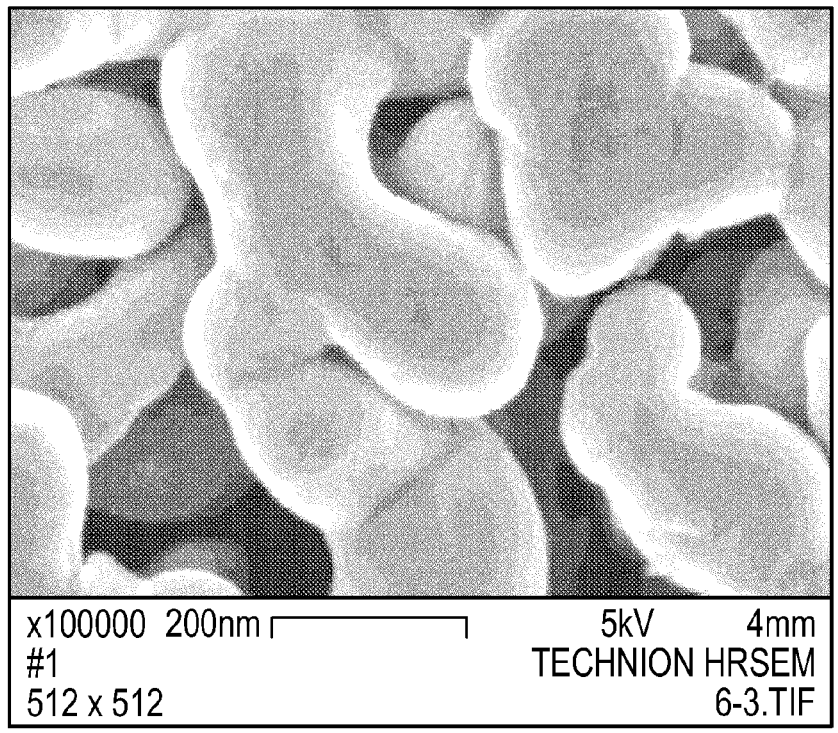

FIGS. 21 and 22 further illustrate the change in particle size that accompanies exposure of metal nano particles, in the form of dry powder, to formic acid vapor at 70° C. The particles also experienced a decrease in surface area from an initial value of 10.3 $mt^2/g$ to 2.5 $mt^2/g$.

FIGS. 15-20 further illustrate that both heat sintering at 150° C. and chemical sintering at 70° C. results in particles that substantially retain their original, non-uniform shapes. After heat sintering, however, the printed pattern retains its dark gray color, whereas after chemical sintering the particles have a silver-like, yellowish color.

The invention will now be described further by way of the following examples.

EXAMPLES

Examples for formulations for each method are described below. These are only representative examples and are described hereby to demonstrate the wide range of possibilities this invention covers, by which we can use the special properties of nano metal powders. It is further acknowledged that the formulations of the hereto-described examples may similarly be made with different binders, solvents, metal powders, additives, polymers, buffers, surfactants, dispersants and/or coupling agents. Nevertheless, according to the present invention, nano powder metals and/or nano powder metal salts characterized by small particle size ($D_{90}<0.1$ μm) which are conductive are especially preferred. Concentrations can be adjusted to control the viscosity and the resistance and transparency of the coated substrate.

Example 1

Admixing a binder (ethyl cellulose; MW=100,000), 13% by weight, in an aromatic ester or aldehyde solvent (terpinol). Further homogenizing 25 parts by weight of the obtained binder solution by a means of a high rpm homogenizer the following materials: Silver nano-powder ($D_{90}<0.1$ μm), 50% (w/w), a solvent (terpinol) 19% (w/w) and a coupling agent (isopropyl dioleic(dioctylphosphato)titanate, also known as the commercially available NDZ-101 KRTTS (Kenrich Petrochemicals, Inc., Bayonne, N.J.), 1% (w/w).

Example 2

Admixing metal nano powder (colloidal silver), 12% (w/w), a binder which is an adhesion promoter (Polyvinyl Pyrrolidone (PVP)), 2.5% (w/w), and deionized water, 32% (w/w). All components are intensively mixed by a means of an ultrasonic energy and/or high rpm dispersing equipment. Separately, admixing metal nano powder (silver nano powder) ($D_{90}<0.1$ μm), 14% (w/w), solvent (ethanol), 39.5% (w/w), by a means of a high rpm homogenizer. Finally, admixing solution obtained in first step with the solution obtained in the second step, so a homogenized solution is obtained.

Example 3

Admixing silver formate salt—1 part by weight, a dispersant (trioctylphoshine oxide) (TOPO), 2% (w/w) in a solvent (ethyl acetate), 80% (w/w). Heating the solution to about 60° C. until all components dissolve. Admixing metal nano powder (silver powder) ($D_{90}<0.1$ μm), 17% (w/w) into the brown solution obtained in the first step, and subsequently homogenizing the obtained mixture by a means of a high rpm homogenizer.

Example 4

Dissolving silver nitrate, 4% (w/w) in a buffer (ammonia, 25% solution, 9.5% (w/w)). Further admixing deionized water, 47% (w/w) and a dispersant (poly-carboxylic ammonium salt, commercially available as Tamol 1124 product from Rohm and Haas Co., Philadelphia, Pa.), 3.5% (w/w), solvent (ethanol), 24% (w/w) and metal nano powder (silver powder) ($D_{90}<0.1$ μm), 12% (w/w) and subsequently homogenizing the obtained mixture by a means of a high rpm homogenizer.

The optical and resistance data for metal nano powder coatings and inks produced in the hereto-defined examples are hereto provided:

TABLE 1

Optical and resistance data for nano metal powders coatings and inks

| Example No. | Printing Geometry | Transmittance % | Resistance ohmsquare | Haze % | Remarks |
|---|---|---|---|---|---|
| Blank | | 92 | | 8 | Glass slides |
| 1 | Screen | 70.3 | 14 | 1.8 | UV opacity |
| 2 | Continuous | 46.3 | 80 | 8.6 | UV opacity |
| 3 | Continuous | 54.5 | 30 | 9.1 | UV opacity |
| 4 | Continuous | 55.6 | 500 | 3.3 | UV opacity |

Light transmittance measured between 400 nm and 700 nm. Heat treatment was provided at 280° C. for about one hour.

It is hence according to another embodiment of the present invention, to present a new and simple method of producing transparent and conductive coatings and inks on top or in glass and/or polymeric surfaces. This novel method is based on spreading of a predetermined mixture defined above on the surface to be coated. While an organic solvent is evaporated from the spread mixture, the self-assembled network-like pattern is developed in situ, i.e., on the surface. After drying is completed, the developed pattern is sintered at relatively low temperatures, e.g. at a temperature ranging from 50° C. to 150° C. for about 2 to 30 minutes. The final resistance of the conductive layer lies in the range of about 1 to 1,000 Ohm/square, light transmittance is in the range of about 50 to 95%, and the haze value is in the range of about 0.5 to 5%.

The said special mixture is a W/O type emulsion of water or water miscible solvent (or a mixture of these solvents) in a suspension of metal fine particles in an organic solvent or mixture of two or more solvents not miscible with water.

The mixture may also contain at least one emulsifying agent, binder or any mixture thereof. Hence, the dispersed phase is selected from the group comprising yet not limited to water, methanol, ethanol, ethylene glycol, glycerol, dimethyl formamid, dimethyl acetamid, acetonitrile, dimethyl sulfoxide, N-methyl pyrrolidone and/or other water miscible solvents.

The continuous phase may be selected from the group comprising yet not limited to petroleum ether, hexanes, heptanes, toluene, benzene, dichloroethane, trichloroethylene, chloroform, dichloromethane, nitromethane, dibromomethane, cyclopentanone, cyclohexanone or any mixture thereof. Preferably, the solvent or solvents used in this continuous phase are characterized by higher volatility than that of the dispersed phase.

Similarly, the emulsifying agents are selected from the group comprising yet not limited to non ionic and ionic compounds, such as the commercially available SPAN-20, SPAN-80, glyceryl monooleate, sodium dodecylsulfate, or any combination thereof. Moreover, the binders are selected from, yet not limited to modified cellulose, such as ethyl cellulose MW 100,000-200,000, modified urea, e.g., the commercial available BYK-410, BYK-411, BYK-420 produced by BYK-Chemie Ltd.

The metal fine particles and nano-powders are selected from, yet not limited to silver, gold, platinum, palladium, nickel, cobalt, copper or any combination thereof, wherein said metal or mixture of metals is characterized by an average particle size smaller then 1 micron, preferably smaller than 0.5 micron, and most preferably smaller then 0.1 micron. The small particle size provides the improved optical properties of the coatings. According to one specifically preferred embodiment, the aforementioned metal or mixture of metals is selected from precious metals due to their enhanced chemical stability and improved electrical conductivity.

TABLE 2

Basic mixture formulation of the nano-inks and nano-powders obtained by the method as defined and described in the above mentioned examples.

| Component | Min. content, % | Max. content, % |
|---|---|---|
| Organic solvent or mixture | 40 | 80 |
| Binder | 0 | 3 |
| Emulsifying agent | 0 | 4 |
| Metal powder | 2 | 10 |
| Water miscible solvent or mixture | 15 | 55 |

The mixture may be prepared in the following way: Emulsifying agent and/or binder dissolved in organic solvent or mixture and metal powder added. Metal powder dispersed in organic phase by ultrasonic treatment, high shear mixing, high speed mixing or any other way used for preparation of suspensions and emulsions. After this water miscible solvent or mixture added and W/O type emulsion prepared by ultrasonic treatment, high shear mixing, high speed mixing or any other way used for preparation emulsions.

The above-mentioned self-assembled network pattern can be developed on different surfaces: glass, polymeric films and sheets (polyesters, polyamides, polycarbonates, polyethylene, polypropylene etc.). The surface to be coated may be both untreated and treated to change its surface properties (e.g., corona treatment or coating by primer). Example of primers that may be used include 1-2% acetone or hexane solutions of 3-Aminopropyl Triethoxy silane, Phenyl Trimethoxysilane, Glycidyl Trimethoxysilane, Tween-80, Neoalkoxy Tri(dioctylpropylphosphato) titanate, etc.

Suitable coating techniques include simple spreading, spin coating, dipping, etc. Wet thickness of coating preferably ranges from 5 to 200 microns.

It is also possible to develop the self-assembled network on glass and then transfer the pattern to a polymer by printing on the polymer.

Example 5

Admixing a surfactant (SDS), 0.1 g in 40 g of water. Admixing then a binder (ethyl cellulose, MW=100,000), 1 g, in a solvent (toluene), 60 g and nano powder metal (silver nano-powder) ($D_{90}$<0.1 μm), 8 g. Then, homogenizing the obtained solution by a means of ultrasonic energy and/or high rpm dispersing equipment. Lastly, admixing 31 g of the solution obtained by the first step with the solution obtained by the second step. This formulation was spread on a glass surface by a manual applicator with a wet thickness of 30 microns. After drying, a self-assembled network pattern developed. Then this pattern was sintered at 150° C. for 10 min. The resulting resistance of the layer was 16 Ω/square. The layer also had a transparency of 55.3% and a haze of 5%.

Example 6

Admixing a metal nano powder (silver powder; maximal particle size is lower than 0.12 micron), 4 g; a solvent (1,2-Dichloroethane), 30 g; a binder (BYK-410), 0.2 g; and homogenizing the solution by a means of an ultra sound at 180 W power for 1.5 min. Then admixing distilled water, 15 g and homogenizing the obtained emulsion by an ultra sound means at 180 W power for 30 sec. This formulation was printed on a glass surface and provided a good developed network with big cells (above 40 μm up to 70 μm and lines about 2-6 μm width). Resistance was 7 Ω/square, transparency 75%, and haze value 1.8%. Reference is made now to FIG. 1, presenting a view taken by a means of a light microscope showing the pattern on glass surface as obtained by the method as described in Example 6.

Example 7

Figure 2:
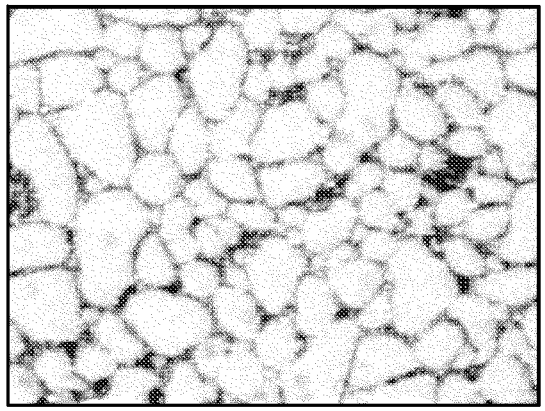
FIG. 2 presents a view taken by a means of a light microscope showing the self-assembling pattern of an ink disposed on a glass surface as obtained by the method of another embodiment of the present invention.

Admixing metal nano powder (silver powder; maximal particle size is lower than 0.12 micron), 4 g; a solvent (toluene), 30 g, a binder (BYK-410), 0.2 g, and homogenizing the solution by a means of an ultra sound at 180 W power for 1.5 min. Then admixing distilled water, 15 g and homogenizing the obtained emulsion by an ultra sound means at 180 W power for 30 sec. This formulation printed on a glass surface gives a good developed network with small cells (about 10 μm and lines about 1 to 4 μm width). Resistance was 7 Ω/square, transparency was 65%, and haze value 3.0% after sintering at 150° C. for 5 min. Reference is made now to FIG. 2, presenting a view taken by a means of a light microscope showing the pattern on glass surface as obtained by the method as described in Example 7.

Example 8

Admixing a binder (BYK-410), 0.06 g; a surfactant (SPAN-80), 0.03 g; a solvent (toluene), 16 g; a co-solvent (cyclopentanone) 0.8 g; nano powder metal (silver powder; (maximal particle size is lower than 0.12 micron), 0.8 g and homogenizing the obtained solution by an ultra sound means at 180 W power for 30 seconds. Then admixing distilled water, 9 ml and homogenizing the obtained emulsion by an ultra sound means at 180 W power for 20 sec. This formulation was printed on glass pretreated with 1% acetone solution of 3-aminopropyl triethoxy silane and gave a good developed network with cells of 40 μm to 70 μm and lines about 2 to 6 μm width. Resistance was 2 Ω/square, transparency was 72%, and haze value was 1.2% after sintering at 50° C. for 30 min in formic acid vapor. The pattern was printed from glass to different polymeric films with almost no change in electrical and optical properties.

Example 9

Figure 3:
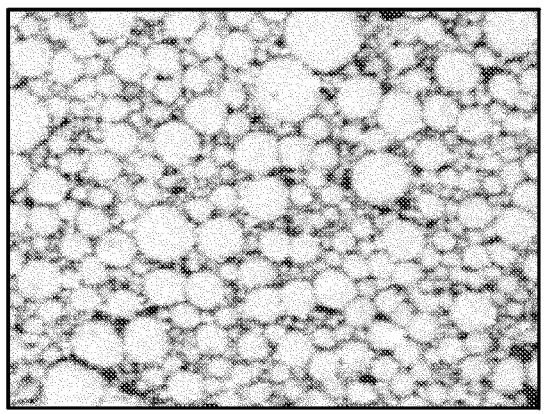
FIG. 3 presents a view taken by a means of a light microscope showing the self-assembling pattern of an ink disposed on a glass surface as obtained by the method of another embodiment of the present invention.

Admixing metal nano powder (silver powder; maximal particle size is lower than 0.12 micron), 4 g; a solvent (trichloroethylene), 30 g; a binder (BYK-410), 0.2 g; and homogenizing the obtained solution by an ultra sound means at 180 W power for 1.5 min. Then admixing distilled water, 15 ml and homogenizing the obtained emulsion by an ultra sound means at 180 W power for 30 sec. This formulation was printed on a glass surface and gave a good developed network with small cells (about 10 to 40 μm and lines of about 2 to 4 μm width). Resistance was 40 Ω/square and transparency was 52% after sintering at 150° C. for 5 min. This formulation was also useful in the case when a high-speed stirrer (Premier-type) is used instead of the ultra sound sonication. In this case, the obtained network cells are bigger and the transparency is improved. This formulation also has better performance while printed on polymer films not dissolved by trichloroethylene, such as PET, PEN, polyethylene. Reference is made now to FIG. 3, presenting a view taken by a means of a light microscope showing the pattern on a glass surface as obtained by the method as described in Example 9.

Example 10

Figure 4:
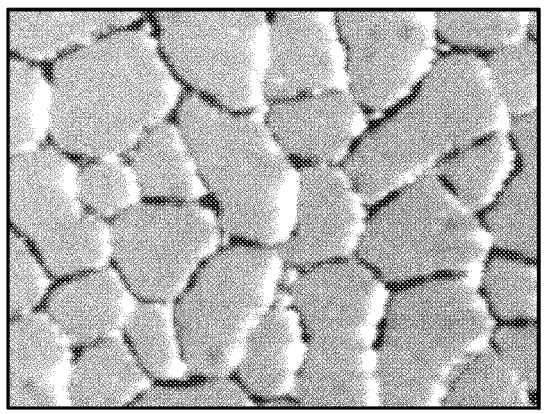
FIG. 4 presents a view taken by a means of a light microscope showing the self-assembling pattern of an ink disposed on a glass surface as obtained by the method of another embodiment of the present invention.
Figure 5:
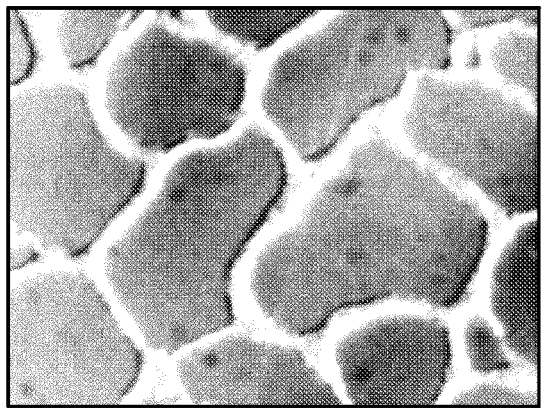
FIG. 5 presents a view taken by a means of a light microscope showing the self-assembling pattern of an ink disposed on a polymeric film as obtained by the method of yet another embodiment of the present invention.
Figure 6:
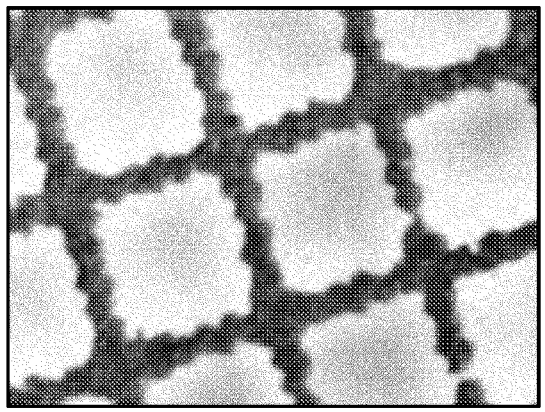
FIG. 6 presents a view showing the printed pattern of ink disposed on a glass surface obtained by the method of another embodiment of the present invention.

Admixing a binder (BYK-410), 0.06 g; a surfactant (SPAN-20), 0.03 g, a solvent (trichloroethylene), 24 g; a co-solvent (cyclohexanone), 0.8 g; metal nano powder (silver powder; maximal particle size is lower than 0.12 micron), 1 g and homogenizing the obtained solution by an ultra sound means at 180 W power for 30 sec. Then admixing distilled water, 9 ml and homogenizing the obtained emulsion by an ultra sound means at 180 W power for 20 sec. This formulation was printed on glass pretreated with 1% acetone solution of 3-aminopropyl triethoxy silane and gave a good developed network with cells of 50 μm up to 100 μm, and lines about 2 to 8 μm width. Resistance was 1.8 Ω/square, transparency 81.3%, haze value 2.6% after sintering at 50° C. for 30 min in formic acid vapor. Reference is made now to FIG. 4, presenting a view taken by a means of a light microscope showing the pattern on glass surface as obtained by the method as described in example 10. The pattern printed on various polymeric films and did not change its electrical and optical properties significantly. Reference is made now to FIG. 5, presenting a view taken by a means of a light microscope showing the pattern on polymeric film as obtained by the method as described in Example 10.

Example 11

Admixing a binder (BYK-411), 0.06 g; a surfactant (SPAN-80), 0.2 g; a solvent (petroleum ether), 10 g; a co-solvent (cyclohexanone), 1 g; metal nano powder (silver powder; (maximal particle size is lower than 0.12 micron), 1 g and homogenizing the obtained solution by an ultra sound means at 180 W power for 30 sec. Then admixing distilled water, 7 ml and homogenizing the obtained emulsion by an ultra sound means at 180 W power for 20 sec. This formulation was printed on polyimide polymer pretreated with 1% acetone solution of phenyl trimethoxysilane and gave a good developed network characterized by cells of above 20 μm up to 60 μm, and lines about 2 to 6 μm width. The resistance was 20 Ω/square, transparency was 78%, and the haze value was 8% after sintering at 150° C. for 5 min.

Example 12

Dry Nano Silver Metal Powders

Silver powders of different sizes, including nano size powders, were produced through the procedure described in U.S. Pat. No. 5,476,535, which is hereto provided as a reference. The powders are coated with organic materials and de-agglomerated. The volume particle size distribution of these powders, measured in a Coulter Particle Size Analyzer LS 230, are presented in Table 3.

TABLE 3

Silver powders used in experiments

| Sample Number | Particle Size Distribution | |
|---|---|---|
| | $D_{50}$ μm | $D_{50}$ μm |
| 1 | 0.054 | 0.067 |
| 2 | 0.054 | 0.066 |
| 3 | 0.052 | 0.063 |
| 4 | 0.246 | 2.851 |
| 5 | 3.22 | 8 |

The electrical resistances of these powders were measured as a function of the sintering process, see Tables 4 and 5.

Figure 7:
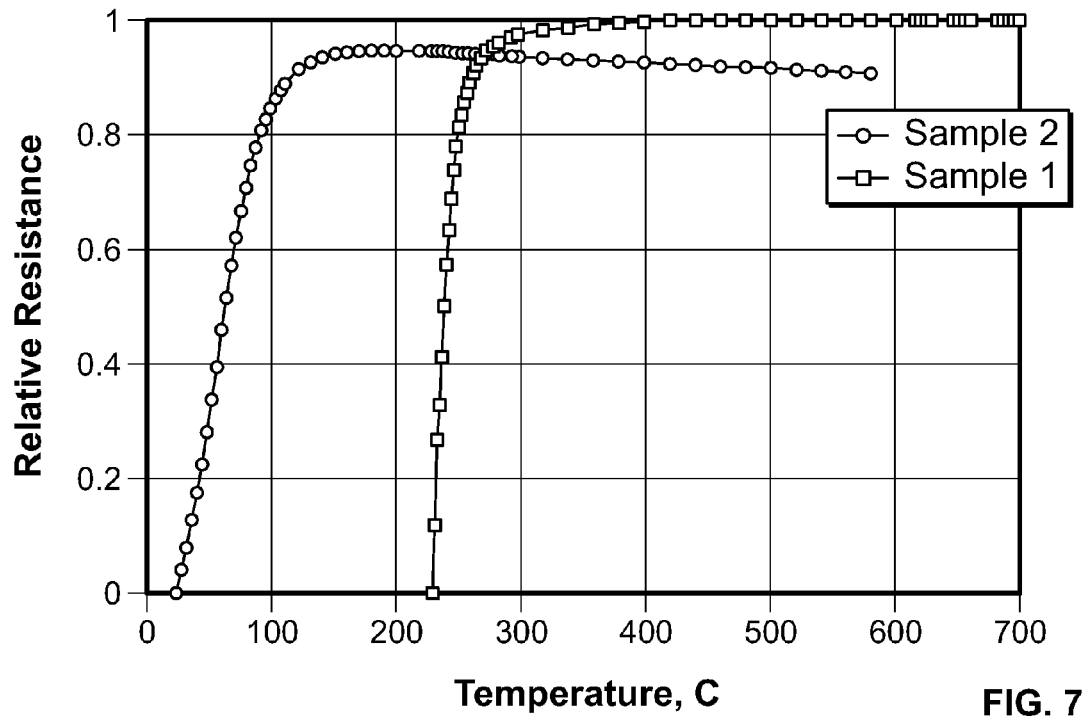
FIG. 7 is a graph illustrating the change of relative resistance for silver nano-powders coated with surfactant (1) and washed from surfactant (2).
Figure 8:
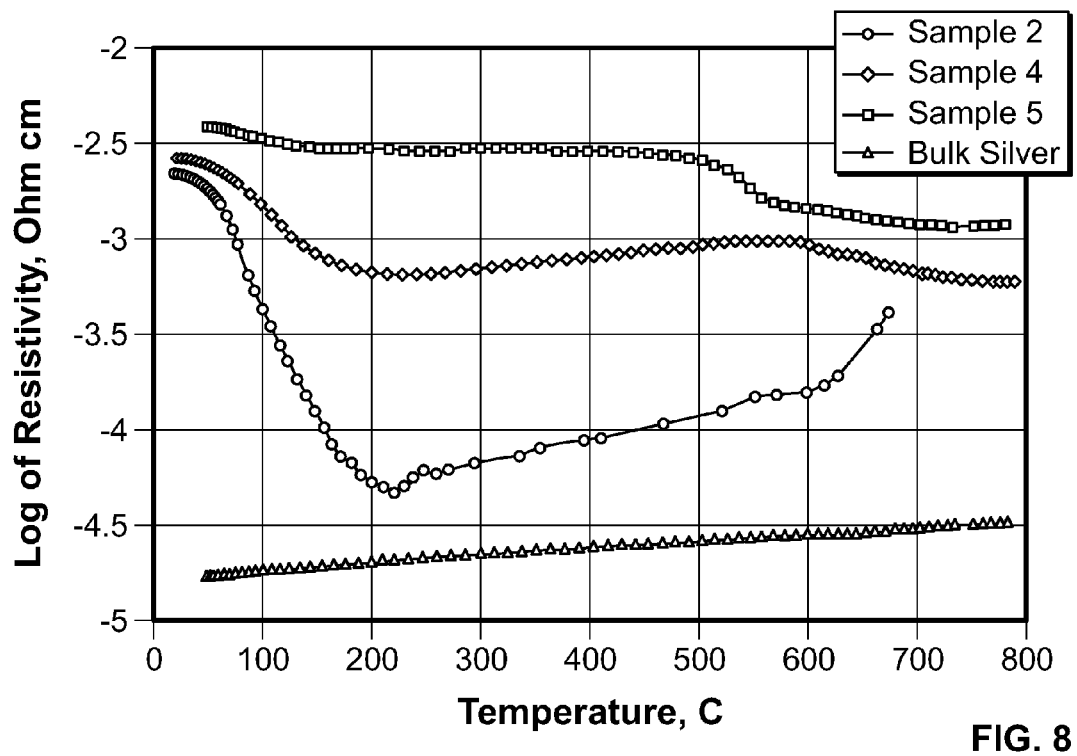
FIG. 8 is a graph illustrating the relative resistance dependence on temperature for the different particle sizes of silver powders and bulk silver.

Reference is made now to FIG. 7, presenting the change of relative resistance for silver nano powders coated with surfactant (1) and washed from surfactant (2). Reference is made now to FIG. 8, presenting the relative resistance dependence on temperature for the different particle size silver powders—and measured bulk silver in our measuring system.

Samples 1, 2 and 3 are nano silver powders; samples 4 and 5 are coarse silver powders with a particle size of over 2.5 μm ($D_{90}$). As can be seen nano silver powder washed from its coating will give the same performance at even lower temperatures of about 100° C. in comparison to around 220° C. for the coated powder and over 700° C. for coarse silver powders.

TABLE 4

Electrical properties of silver powders

| Sample 1 (coated with surfactant) | | | Sample 2 (washed from surfactant) | | |
|---|---|---|---|---|---|
| Resistance R, Ω | Resistivity ρ, Ω * cm | Temperature ° C. | Resistance R, Ω | Resistivity ρ, Ω * cm | Temperature ° C. |
| 1300 | 7.60 | 236 | 0.1065 | 1.24E-3 | 62 |
| 131 | 076 | 270 | 0.0166 | 1.94E-4 | 127 |

TABLE 5

Electrical properties of different particle size silver powders at different sintering temperatures.

| | T = 120° C. | | T = 220° C. | |
|---|---|---|---|---|
| Sample Number | Resistance R, Ω | Resistivity ρ, Ω * cm | Resistance R, Ω | Resistivity ρ, Ω * cm |
| 2 | 0.0203 | 2.40E−4 | 0.0034 | 3.98E−5 |
| 4 | 0.1600 | 1.20E−3 | 0.0860 | 6.61E−4 |
| 5 | 0.4620 | 3.24E−3 | 0.4200 | 2.95E−3 |
| Bulk Silver* | 0.0040 | 1.95E−5 | 0.0045 | 2.14E−5 |

*Bulk silver measured under same conditions and set-up.

Example 13

Dry Nano Copper Metal Powders

Copper powders of different sizes, including nano sizes, including nano size powders were produced through the procedure described in U.S. Pat. No. 5,476,535, which is hereto provided as a reference. The powders were coated with organic materials and de-agglomerated. The volume particle size distribution of these powders, measured in a Coulter Particle Size Analyzer LS 230, are presented in Table 6.

TABLE 6

Copper powders used in experiments

| Sample | Particle Size Distribution | | Surface area |
|---|---|---|---|
| Number | $D_{50}$ μm | Mean μm | $M^2/g$ |
| AS0873 | 0.073 | 0.181 | 78.2 |
| ASX0871 | 0.35 | 0.317 | 6.0 |
| ASX13-1 | 3.4 | 3.4 | 1.3 |

Figure 9:
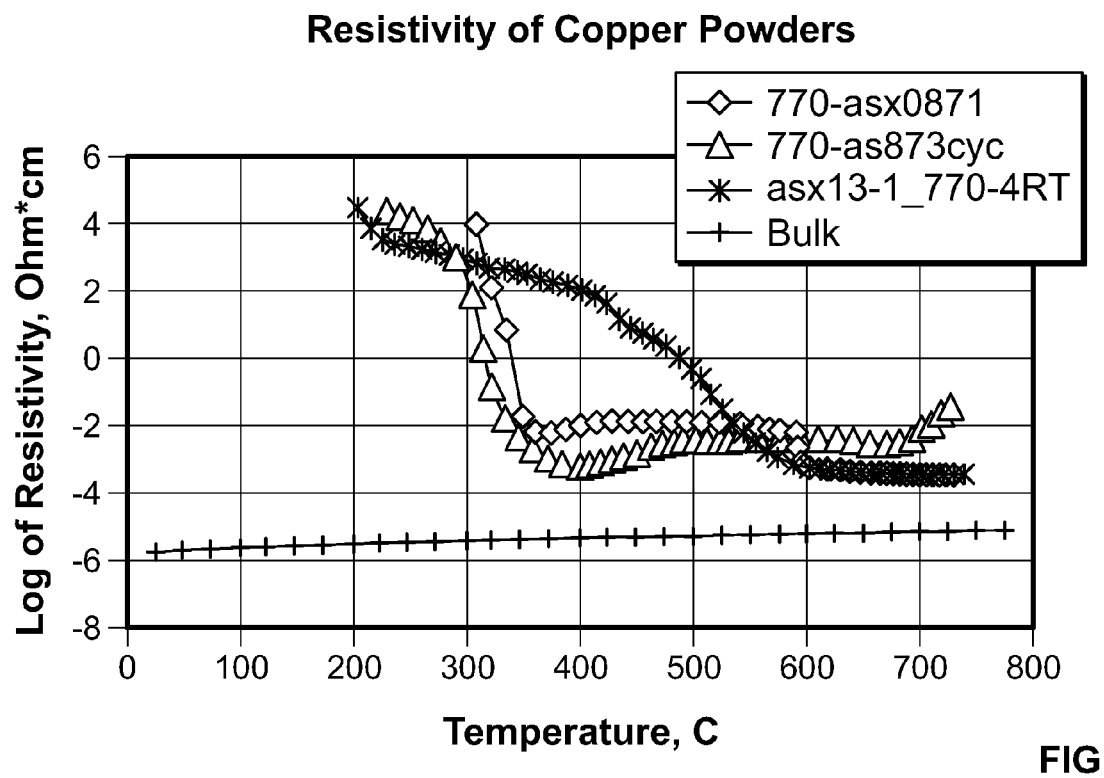
FIG. 9 is a graph illustrating the relative resistance dependence on temperature for the different particle sizes of copper powders and bulk copper.
Figure 10:
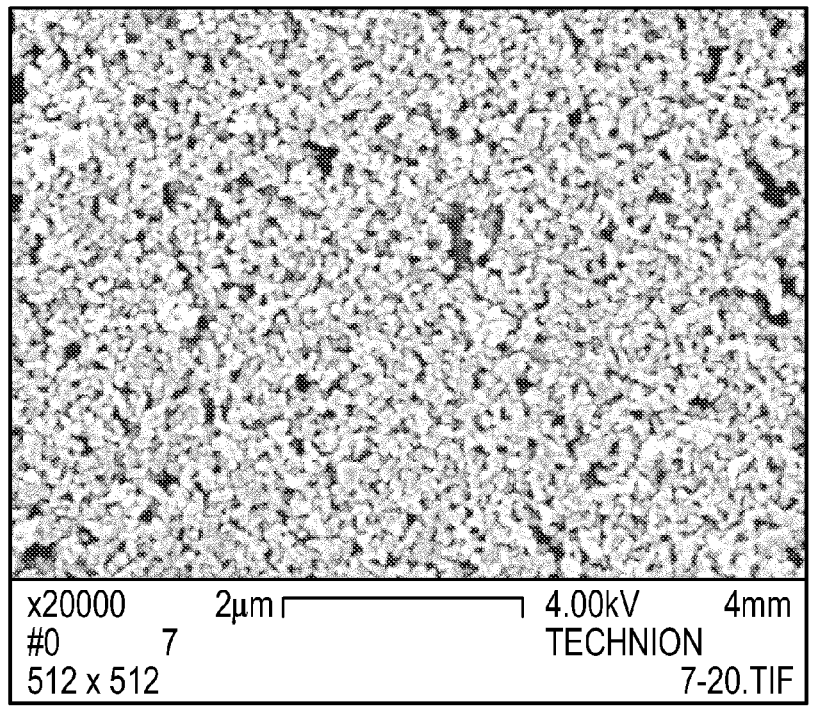
FIGS. 10 and 11 are Scanning Electron Microscopy Photographs of representative nano metal particles.
Figure 11:
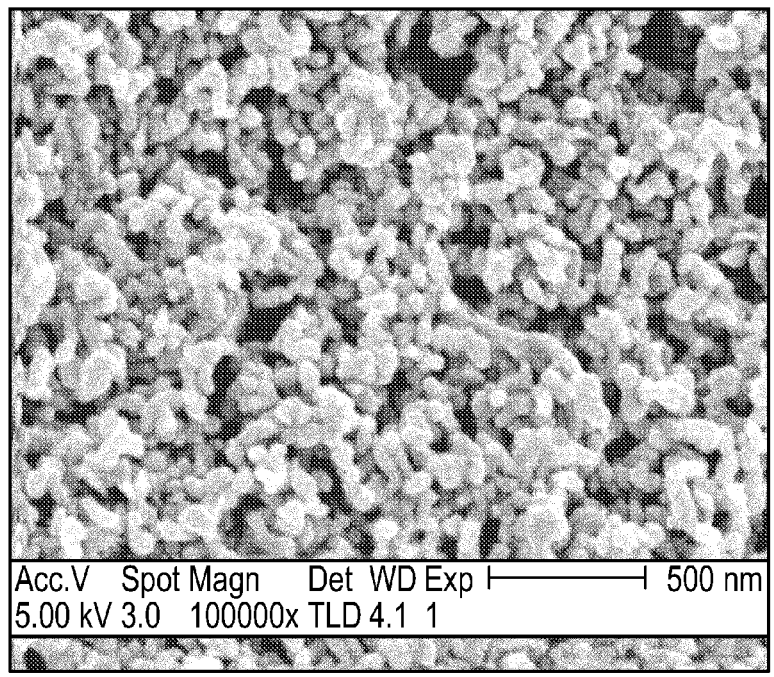

The electrical resistances of these powders were measured as a function of the sintering process. Reference is made hence to FIG. 9, presenting the relative resistance dependence on temperature for the different particle size copper powders—and measured bulk copper in our measuring system.

Example 14

Nano Metal Powders in Formulations

The formulations are inks or pastes, which facilitate the printing and/or coating process, and were prepared according to the general procedures described below. Care has to be taken to achieve a good dispersion of the conductive additives (metal nano powders, salts and/or colloids).

Three ink/paste systems were tested. All three have been found to produce a conductive coating at low sintering temperatures. The systems differ in the formulation concept and main ingredients leading to the conductivity. The main ingredients of the systems are: 1) metal nano powder, 2) metal nano powder with metal colloids, 3) metal nano powder with a metal reducible salt.

Examples for formulations for each method are described below. Resistance results for these systems re presented in Table 7.

System 1 Formulation

Admixing a binder (ethyl cellulose), 13% (wt/wt) in a solvent (terpinol). Then, admixing a conductive nano powder metal (silver nano powder) (D90<0.1 μm); 50 parts by weight; terpinol 20 parts by weight, and a coupling agent such as isopropyl dioleic (dioctylphosphato)titanate, also known as the commercially available NDZ-101 KRTTS, 1 part by weight, to some 25 parts by weight of the solution obtained above, by a means of a high rpm homogenizer.

System 2 Formulation

Intensively admixing colloidal silver, 12 parts by weight; a binder which is also an adhesion promoter (Polyvinyl Pyrrolidone (PVP)), 2.5 parts by weight; water, 32 parts by weight by a means of an ultrasonic energy and/or high rpm dispersing equipment. Then, admixing a conductive nano powder metal (silver nano powder) ($D_{90}$<0.1 μm), 14 parts by weight; solvent (ethanol), 39.5 parts by weight by a means of a high rpm homogenizer. Finally combining the second mixture with the first mixture while mixing and stirring thoroughly.

System 3 Formulation

Admixing silver formate salt, 1 part by weight; a dispersant (trioctylphoshine oxide (TOPO)), 2 parts by weight; and a solvent (ethyl acetate), 80 parts by weight at about 60° C. until all components dissolve. Then, admixing a conductive nano powder metal (silver nano powder) ($D_{90}$<0.1 μm), 17 parts by weight to the obtained brown solution by a means of a high rpm homogenizer.

TABLE 7

Resistance data for nano metal powders ink formulations

| System | Formulation | Resistance Ω/square | Resistivity Ωcm | Sintering Temperature, ° C. |
|---|---|---|---|---|
| 1 | P0010 | 0.7 | 2.84E−4 | 120 |
| 1 | P0010 | 0.05 | 2.03E−5 | 300 |
| 3 | C116 | 2.8 | 6.72E−5 | 120 |
| 3 | C116 | 1.17 | 2.93E−5 | 300 |
| 2 | C121 | 0.255 | 3.09E−4 | 100 |
| | Bulk Silver* | 0.004 | 1.95E−5 | 120 |
| | Bulk Silver* | 0.0045 | 2.14E−5 | 220 |

*Bulk silver measured under same conditions and set-up

In Examples 15-22, the nano metal powder was prepared as follows.

Silver nano powder was prepared by making a melt of 24.4% by weight of silver, 0.6% by weight copper and 75% aluminum (e.g., 243.8 grams silver, 6.3 grams copper, and 750 grams aluminum) in a stirred graphite crucible under air at a temperature of at least 661° C. The melt was poured into a 14 mm thick mold made from steel. The molded ingot was left to cool at room temperature, and then annealed in an electrical furnace at 400° C. for 2 hours. The annealed ingot was left to cool at room temperature, and then rolled at room temperature in a rolling machine (from 13 mm thickness to 1 mm thickness in 24 passes). The sheets were cut and heat treated in an electrical furnace at 440° C. for 4 hours. The heated sheets were quenched in water at room temperature. The sheets were then leached in an excess of a NaOH solution (25% by weight in deionized water—density 1.28 grams/ml at room temperature, 1.92 kg NaOH solution per 0.1 kg alloy) at a starting temperature of 28° C. and while cooling to keep the temperature below 70° C. for 12 hours (leaching reactor without external agitation).

The NaOH solution was then decanted and a new portion of 25% NaOH solution was added (40 gram per 0.1 kg starting alloy) and left for 2 hours. The powder produced at this stage had a prime particle size below 80 nm, as measured by XRD and SEM, and a surface area greater than 5 mt2/gram. An ethanol solution was prepared by dissolving 15.66 grams Span 20 and 2.35 grams hexadecanol in 750 ml ethanol. 500 grams of leached dry powder was added to the ethanolic solution and stirred for 2 hours. The slurry was poured into a tray and the ethanol evaporated at a temperature below 45° C. The coated powder was then passed through a jet mill to get a de-agglomerated silver nano powder with particle size (D90) below 80 nm, as measured by laser diffraction.

The powder produced in the previous steps was further washed with hot ethanol several times (between 3 and 5 times), and then dried in tray until all the ethanol evaporated at a temperature below 45° C.). A de-agglomerated silver nano powder with particle size (D90) below 80 nm, as measured by laser diffraction, and organic coating of less than 1.2% by weight, as measured by TGA, was obtained.

Example 15

A dispersion of 20% by weight of silver nano powder (#473-G51) (prepared as described above), 1% Disperbyk® 190 (available from BYK-Chemie, Wesel Germany), 0.027% BYK® 348 (also available from BYK-Chemie), 0.067% PVP K-15 (available from Fluka), 0.313% AMP (2-amino-2-methyl-propanol), 15.76% NMP (1-methyl pyrrolidinone), and the balance water was prepared by mixing the additives with the solvents and water, then adding the silver nano powder in portions while mixing at 4000 rpm with a high speed Premier Mill Laboratory Dispersator Series 2000 Model 90 (Premier Mill Corp. USA) having a 47 mm diameter dissolver shaft, until the minimum PSD was achieved (D100 77 nm). Typically, homogenization was performed for 10 min. The viscosity of the composition was determined to bet 15 cP using a Brookfield Viscometer. A surface tension of 47.5 mN/m was measured using the Dunoy method. A conductive pattern was printed with this dispersion using a Lexmark printer Z602, cartridge Lexmark Black 17 and 16 in which the black ink had been replaced with this dispersion. The dispersion was printed on HP photoquality paper semi-glossy (C6984A). Two passes were performed. The conductive pattern was exposed to formic acid vapor (formic acid/water solution, 85% by weight) at 70° C. for 30 minutes, after which its resistance was measured and determined to be 0.23 Ω/square.

Example 16

The process of Example 15 was repeated. The resistance of the sample was measured and determined to be 0.11 Ω/square. This is equivalent to a resistivity of 7 Ωcm (calculated by measuring the thickness of the printed pattern with a surface profilometer).

Example 17

The process of Example 15 was repeated except that the dispersion was prepared by diluting a dispersion having 60 wt. % silver nano powder. A conductive pattern was printed with an applicator (draw bar) to form a coating having a wet thickness of 30 μm. The pattern was exposed to formic acid vapor (formic acid/water solution, 85% by weight) at 70° C. for 30 minutes, after which its resistance was measured and determined to be 0.2 Ω/square. This is equivalent to a resistivity of 9 μΩcm (calculated by calculating the thickness of the printed pattern from the weight of the deposited material).

Example 18

The process of Example 17 was followed except that the printed pattern, after drying, was exposed to acetic acid vapors at 70° C. for 30 minutes, after which its resistance was measured and determined to be 18 Ω/square. This is equivalent to a resistivity of 500 μΩcm (calculated by calculating the thickness of the printed pattern from the weight of the deposited material).

Example 19

The process of Example 17 was followed except that the printed pattern, after drying, was exposed to formaldehyde vapors at 70° C. for 30 minutes, after which its resistance was measured and determined to be 5 Ω/square. This is equivalent to a resistivity of 200 Ωcm (calculated by calculating the thickness of the printed pattern from the weight of the deposited material).

Example 20

The process of Example 17 was followed except that the printed pattern, after drying, was dipped in acetic acid.

Example 21

The process of Example 17 was followed except that the printed pattern, after drying, was dipped in formaldehyde.

Example 22

The process of Example 17 was followed except that it was prepared with 60 wt. % silver nano powder.

Example 23

Admixing a binder (BYK-410), 0.28 g; a surfactant (SPAN-80), 0.04 g, a solvent (trichloroethylene), 42 g; a co-solvent (toluene), 23 g; metal nano powder (silver powder; maximal particle size is lower than 0.12 micron), 4 g and homogenizing the obtained solution by an ultra sound means at 180 W power for 1.5 min. Then admixing distilled water, 25 g and homogenizing the obtained emulsion by means of a high speed mixer at 1000 rpm for 2 min. This formulation was spread on a glass surface and gave a good developed network Resistance was 30 Ω/square, transparency was 70.3%, haze value was 2.6% after sintering at 150° C. for 5 min.

Example 24

Admixing a binder (BYK-410), 0.03 g; a surfactant (SPAN-80), 0.03 g, a solvent (trichloroethylene), 22.7 g; a co-solvent (cyclohexanone), 0.51 g; metal nano powder (silver powder; maximal particle size is lower than 0.12 micron), 3 g and homogenizing the obtained solution by an ultra sound means at 180 W power for 30 sec. Then adding a 0.005% water solution of a substrate wetting additive (BYK-348), 16 g and homogenizing the obtained emulsion by means of ultra sound at 180 W power for 20 sec. This formulation was spread by manual applicator on a glass surface pretreated with a 1% acetone solution of 3-aminopropyl triethoxy silane (wet thickness=30 microns) and gave a well-developed pattern. Resistance was 2.5 Ω/square, transparency was 89.1%, haze value was 2.6% after sintering at 50° C. for 15 min. in formic acid vapor.

Example 25

The formulation of Example 24 was spread on a 3-aminopropyl triethoxy silane-treated glass surface by manual applicator (wet thickness=60 microns). Resistance was 0.8 Ω/square, transparency was 78.1%, haze value was 3.8% after sintering at 50° C. for 15 min. in formic acid vapor.

Example 26

Admixing a binder (BYK-410), 0.03 g; a surfactant (SPAN-80), 0.05 g, a solvent (toluene), 16.47 g; a co-solvent (cyclohexanone), 0.95 g; metal nano powder (silver powder; maximal particle size is lower than 0.12 micron), 1.7 g and homogenizing the obtained solution by an ultra sound means at 180 W power for 30 sec. Then adding water, 16 g, and homogenizing the obtained emulsion by means of ultra sound at 180 W power for 30 sec. This formulation was spread by manual applicator on a PPC polyester film (available from Jolybar Filmtechnics Products Converting (1987) Ltd., Netanya, Israel) (wet thickness=30 microns) and gave a well-developed pattern. Resistance was 7 Ω/square and transparency was 85.1% after sintering at 50° C. for 15 min. in formic acid vapor.

Example 27

Admixing a binder (BYK-410), 0.05 g; a surfactant (SPAN-80), 0.05 g, a solvent (1,2-dichloroethane), 36.3 g; metal nano powder (silver powder; maximal particle size is lower than 0.12 micron), 1.7 g and homogenizing the obtained solution by an ultra sound means at 180 W power for 30 sec. Then adding water, 8 g, and homogenizing the obtained emulsion by means of ultra sound at 180 W power for 30 sec. This formulation was spread by manual applicator on a PPC polyester film (available from Jolybar Filmtechnics Products Converting (1987) Ltd., Netanya, Israel) (wet thickness=30 microns) and gave a well-developed pattern. Resistance was 5 Ω/square and transparency was 82.8% after sintering at 50° C. for 15 min. in formic acid vapor.

A number of embodiments of the invention have been described. Nevertheless, it will be understood that various modifications may be made without departing from the spirit and scope of the invention. Accordingly, other embodiments are within the scope of the following claims.

The invention claimed is:

1. A method of producing an article comprising:
(a) providing a composition comprising nano-particles dispersed in a liquid carrier
comprising (a) water, a water-miscible organic solvent, or combination thereof and (b) an organic solvent that evaporates more quickly than the water, water-miscible organic solvent, or combination thereof,
wherein the combination of (a) the water, water-miscible organic solvent, or combination thereof and (b) the organic solvent that evaporates more quickly than the water, water-miscible solvent, or combination thereof, together form an emulsion;
(b) applying the composition to a surface of a substrate; and
(c) drying the composition to remove the liquid carrier, whereupon the nano-particles self-assemble to form a transparent and electrically conductive coating in the form of a network-like pattern that includes interconnected traces defining randomly shaped cells on the surface of the substrate,
wherein the coating is transparent to light at wavelengths in the range of 400 to 700 nm.

2. A method according to claim 1 comprising sintering the nano-particles at a temperature no greater than 300° C. following application to the surface of the substrate.

3. A method according to claim 1 comprising sintering the nano-particles at a temperature no greater than 150° C. following application to the surface of the substrate.

4. A method according to claim 1 comprising sintering the nano-particles at a temperature no greater than 50° C. following application to the surface of the substrate.

5. A method according to claim 1 comprising sintering the nano-particles at a temperature between 50 and 300° C. following application to the surface of the substrate.

6. A method according to claim 1 comprising sintering the nano-particles at a temperature between 50 and 150° C. following application to the surface of the substrate.

7. A method according to claim 1 comprising exposing the nano-particles to a chemical reagent following application to the surface of the substrate to reduce the electrical resistance of the network.

8. A method according to claim 7 wherein the chemical reagent is in the form of a vapor.

9. A method according to claim 7 wherein the chemical reagent is in the form of a liquid.

10. A method according to claim 7 wherein the chemical reagent comprises an organic acid.

11. A method according to claim 10 wherein the organic acid comprises formic acid.

12. A method according to claim 10 wherein the organic acid comprises acetic acid.

13. A method according to claim 7 wherein the chemical reagent comprises an organic aldehyde.

14. A method according to claim 13 wherein the organic aldehyde comprises formaldehyde.

15. A method according to claim 7 comprising exposing the nano-particles to the chemical reagent at ambient temperature.

16. A method according to claim 1 comprising sintering the nano-particles at a temperature no greater than 300° C. in the presence of an organic acid selected from the group consisting of formic acid, acetic acid, and combinations thereof following application to the substrate.

17. A method according to claim 1 comprising sintering the nano-particles at a temperature no greater than 150° C. in the presence of an organic acid selected from the group consisting of formic acid, acetic acid, and combinations thereof following application to the substrate.

18. A method according to claim 1 comprising sintering the nano-particles at a temperature no greater than 50° C. in the presence of an organic acid selected from the group consisting of formic acid, acetic acid, and combinations thereof following application to the substrate.

19. A method according to claim 1 comprising sintering the nano-particles at a temperature between 50 and 300° C. in the presence of formic acid following application to the substrate.

20. A method according to claim 1 wherein the substrate is selected from the group consisting of glass substrates, rigid polymer substrates, flexible polymer substrates, and combinations thereof.

21. A method according to claim 1 wherein the substrate is selected from the group consisting of metal substrates, ceramic substrates, and combinations thereof.

22. A method according to claim 1 wherein the substrate is a paper substrate.

23. A method according to claim 1 wherein the substrate comprises a polymer substrate having a glass transition temperature no greater than 150° C.

24. A method according to claim 1 comprising applying the composition to the surface of the substrate according to a predetermined pattern.

25. A method according to claim 1 wherein the nano-particles comprise a metal element.

26. A method according to claim 1 wherein the nano-particles comprise a metal oxide.

27. A method according to claim 1 wherein the nano-particles include a metal element selected from the group consisting of silver, gold, platinum, palladium, nickel, cobalt, copper, and combinations thereof.

28. A method according to claim 1 wherein the nano-particles are prepared according to a process comprising:
    (a) forming an alloy comprising an auxiliary metal and a metal; and
    (b) treating the alloy with a leaching agent to remove the auxiliary metal.

29. A method according to claim 28 wherein the auxiliary metal comprises aluminum.

30. A method according to claim 1 wherein the nano-particles have a D90 value of less than 0.1 µm.

31. A method according to claim 1 wherein the water-miscible organic solvent is selected from the group consisting of methanol, ethanol, ethylene glycol, glycerol, dimethylformamide, dimethylacetamide, acetonitrile, dimethylsulfoxide, N-methylpyrrolidone, and combinations thereof.

32. A method according to claim 1 wherein the organic solvent that evaporates more quickly than water, the water-miscible solvent, or combination thereof is selected from the group consisting of petroleum ether, hexane, heptane, toluene, benzene, dichloroethane, trichloroethylene, chloroform, dichloromethane, nitromethane, dibromomethane, cyclopentanone, cyclohexanone, and combinations thereof.

33. A method according to claim 1 wherein the composition further comprises an agent selected from the group consisting of polymers, binders, surfactants, dispersants, coupling agents, and combinations thereof.

34. A method according to claim 1 wherein the network has a percent light transmission of 10% to 90% at a wavelength of 400 nm to 700 nm.

35. A method according to claim 1 wherein the network has a percent light transmission of 30% to 90% at a wavelength of 400 nm to 700 nm.

36. A method according to claim 1 wherein the network has a haze value of 0.1% to 10%.

37. A method according to claim 1 wherein the network has a haze value of 0.50% to 50%.

38. A method according to claim 1 wherein the network has an electrical resistance of 0.1 Ω/square to 1,000 Ω/square.

39. A method according to claim 1 wherein the network has an electrical resistance of 0.1 Ω/square to 10,000 Ω/square.

40. A method according to claim 1 wherein the network has an electrical resistance of 0.1 Ω/square to 10,000 Ω/square and has a percent transmission of 10% to 90% at a wavelength of 400 nm to 700 nm.

41. A method according to claim 1 further comprising transferring the network to a second substrate.

42. A method according to claim 1 comprising applying the composition to the surface of the substrate by ink jet printing.

43. A method of producing an article comprising:
    (A) providing an emulsion comprising nano-particles dispersed in a liquid carrier that includes (a) water, a water-miscible organic solvent, or combination thereof and (b) an organic solvent that evaporates more quickly than the water, water-miscible solvent, or combination thereof,
    wherein the combination of (a) the water, water-miscible organic solvent, or combination thereof and (b) the organic solvent that evaporates more quickly than the water, water-miscible solvent, or combination thereof, together form the emulsion,
    wherein the nano-particles have a D90 value of less than 0.1 µm and are prepared according to a process comprising:
    (i) forming an alloy comprising aluminum and a metal; and
    (ii) treating the alloy with a leaching agent to remove the aluminum;
    (B) applying the composition to a surface of a substrate;
    (C) drying the composition to remove the liquid carrier, whereupon the nano-particles self-assemble to form an article comprising the nano-particles in the form of an electrically conductive network on the surface of the substrate; and
    (D) sintering the nano-particles at a temperature no greater than 50° C. in the presence of an organic acid following application to the surface of the substrate,
    wherein the network is transparent to light at wavelengths in the range of 400 to 700 nm and has an electrical resistance of 0.1 Ω/square to 1,000 Ω/square.

* * * * *

UNITED STATES PATENT AND TRADEMARK OFFICE
CERTIFICATE OF CORRECTION

PATENT NO. : 7,736,693 B2
APPLICATION NO. : 11/010948
DATED : June 15, 2010
INVENTOR(S) : Arkady Garbar et al.

Page 1 of 1

It is certified that error appears in the above-identified patent and that said Letters Patent is hereby corrected as shown below:

On the Title Page, Item (56) References Cited, Other Publications, A. S. Reshamwala reference, please delete "et a l," and insert --et al.-- therefor;

Column 21, line 44 (Claim 37), please delete "50%" and insert --5%-- therefor.

Signed and Sealed this
Twenty-sixth Day of July, 2011

David J. Kappos
*Director of the United States Patent and Trademark Office*